US012810943B2

(12) United States Patent
Wang et al.

(10) Patent No.: US 12,810,943 B2
(45) **Date of Patent: *Nov. 24, 2026**

(54) MEMORY DEVICE, OPERATION METHOD OF MEMORY DEVICE, AND MEMORY SYSTEM

(71) Applicant: YANGTZE MEMORY TECHNOLOGIES CO., LTD., Wuhan (CN)

(72) Inventors: Yan Wang, Wuhan (CN); Ke Liang, Wuhan (CN); Chunyuan Hou, Wuhan (CN); Jialiang Deng, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 236 days.

This patent is subject to a terminal disclaimer.

(21) Appl. No.: 18/389,957

(22) Filed: Dec. 20, 2023

(65) Prior Publication Data

US 2025/0104776 A1 Mar. 27, 2025

(30) Foreign Application Priority Data

Sep. 26, 2023 (CN) ......................... 202311255087.2

(51) Int. Cl.

| | |
|---|---|
| ***G11C 16/24*** | (2006.01) |
| ***G11C 16/04*** | (2006.01) |
| ***G11C 16/10*** | (2006.01) |
| ***G11C 16/26*** | (2006.01) |
| ***G11C 16/32*** | (2006.01) |
| ***G11C 16/34*** | (2006.01) |

(52) U.S. Cl.

CPC .......... *G11C 16/24* (2013.01); *G11C 16/0466* (2013.01); *G11C 16/0483* (2013.01); *G11C 16/10* (2013.01); *G11C 16/26* (2013.01); *G11C 16/32* (2013.01); *G11C 16/3459* (2013.01)

(58) Field of Classification Search

CPC . G11C 16/24; G11C 16/0466; G11C 16/0483; G11C 16/10; G11C 16/26; G11C 16/32; G11C 16/3459

See application file for complete search history.

(56) References Cited

U.S. PATENT DOCUMENTS 9,672,879 B1 * 6/2017 Lee ...................... G11C 7/1051
10,339,989 B2 * 7/2019 Kim ...................... G11C 5/147

(Continued)

*Primary Examiner* — Amir Zarabian
*Assistant Examiner* — Justin Bryce Heisterkamp
(74) *Attorney, Agent, or Firm* — Conley Rose, P.C.

(57) ABSTRACT

A memory device includes a memory array and a peripheral circuit coupled to the memory array. The memory array includes a first memory cell and a second memory cell coupled to a same bit line and being adjacent. The peripheral circuit includes a page buffer circuit. The page buffer circuit includes: a sensing node coupled to the bit line; a first latch circuit coupled to the sensing node, and configured to latch a programmed state of first memory cell; a charge and discharge circuit coupled to the sensing node, and configured to: charge the sensing node, and discharge the sensing node, wherein discharge duration of the sensing node is related to the programmed state; and a second latch circuit coupled to the sensing node, and configured to latch, according to a voltage value of the sensing node after the discharge duration, information of whether second memory cell passes program verification.

20 Claims, 18 Drawing Sheets

(56) References Cited

U.S. PATENT DOCUMENTS

| | | | | |
|---|---|---|---|---|
| 11,996,154 | B2 * | 5/2024 | Choi | G11C 16/14 |
| 2022/0230691 | A1 * | 7/2022 | Choi | G11C 11/5628 |
| 2023/0117575 | A1 * | 4/2023 | Jang | G11C 11/5642<br>365/189.011 |
| 2023/0290388 | A1 * | 9/2023 | Du | G11C 7/1039 |
| 2024/0127883 | A1 * | 4/2024 | Jung | G11C 11/4093 |
| 2024/0272824 | A1 * | 8/2024 | Li | G06F 3/0604 |
| 2025/0014656 | A1 * | 1/2025 | Zhu | G11C 16/20 |
| 2025/0022519 | A1 * | 1/2025 | Zhao | G11C 16/0483 |

* cited by examiner

MEMORY DEVICE, OPERATION METHOD OF MEMORY DEVICE, AND MEMORY SYSTEM

CROSS-REFERENCE TO RELATED APPLICATIONS

The present application claims priority to Chinese Patent Application No. 2023112550872, which was filed Sep. 26, 2023, is titled "A STORAGE DEVICE, STORAGE DEVICE OPERATING METHOD AND STORAGE SYSTEM," and is hereby incorporated herein by reference in its entirety.

TECHNICAL FIELD

The present disclosure relates to the field of semiconductor chip technologies, and in particular, to a memory device, an operation method of memory device, and a memory system.

BACKGROUND

As a non-volatile memory device, a NAND flash memory has advantages of low costs, high capacity, fast overwrite speed, etc. In the NAND flash memory, a peripheral circuit typically supplies power to a memory cell, to achieve various logic operations, for example, a read operation, a program operation, and an erase operation.

SUMMARY

Examples disclosed in the present disclosure provide a memory device, an operation method of memory device, and a memory system, which are used to shorten a time of program of the memory device.

In a first aspect, a memory device is provided. The memory device comprises a memory array and a peripheral circuit coupled to the memory array. The memory array comprises a first memory cell and a second memory cell that are coupled to a same bit line. The first memory cell and the second memory cell are adjacent. The peripheral circuit comprises a page buffer circuit. The page buffer circuit comprises: a sensing node, coupled to the bit line; a first latch circuit, coupled to the sensing node, and configured to latch a programmed state of the first memory cell; a charge and discharge circuit, coupled to the sensing node, and configured to: charge the sensing node, and discharge the sensing node, wherein discharge duration of the sensing node is related to the programmed state of the first memory cell; and a second latch circuit, coupled to the sensing node, and configured to latch, according to a voltage value of the sensing node after the discharge duration, information of whether the second memory cell passes program verification.

In the present disclosure, the first latch circuit is disposed in a page buffer. The first latch circuit is coupled to the sensing node, and is configured to latch the programmed state of the first memory cell. In this way, during verification of the second memory cell (the second memory cell is adjacent to the first memory cell), in the present disclosure the discharge duration of the sensing node by the charge and discharge circuit is controlled according to the programmed state of the first memory cell latched by the first latch circuit. At a same verify voltage, when the discharge duration is longer, more charges are released by the sensing node, a voltage drop value of the sensing node is larger, and it is more difficult for the second memory cell to pass verification. In this case, the second memory cell continues to be programmed, to make the second memory cell store more charges. That is, at the same verify voltage, different discharge duration may make the second memory cell store different numbers of charges. For a same programmed level, during verification of the second memory cell in a other solution, a plurality of (two or more) different verify voltages are sequentially used to perform repeated verification, so that numbers of charges stored in the second memory cell are different. Therefore, for the same programmed level, compared with the other solution, only one verify voltage is used to verify the second memory cell in the present disclosure, so that program duration is greatly shortened.

In some examples, the charge and discharge circuit comprises a charge circuit and a discharge circuit. A first end of the charge circuit is configured to input a supply voltage, and a second end of the charge circuit is coupled to the sensing node, and is configured to charge the sensing node. A first end of the discharge circuit is coupled to the bit line, and a second end of the discharge circuit is coupled to the sensing node, and is configured to discharge the sensing node. The sensing node is first charged through the charge circuit, and then the sensing node is discharged through the discharge circuit, so as to apply various bit line voltages, for example, a program select voltage, a program inhibit voltage, etc. to the bit line.

In some examples, the programmed state of the first memory cell comprises a first state and a second state, and a threshold voltage of the first memory cell when in the first state is greater than a threshold voltage when in the second state. When the programmed state of the first memory cell is the first state, the discharge duration of the sensing node is first duration; when the programmed state of the first memory cell is the second state, the discharge duration is second duration; and the first duration is less than the second duration. The discharge duration of the sensing node is equal to a difference between a moment at which the discharge circuit stops discharging the sensing node and a moment at which the charge circuit stops charging the sensing node. The programmed state of the first memory cell affects a parallel channel charge loss of the second memory cell. After the second memory cell has been programmed, if the first memory cell is the first state, the parallel channel charge loss of the second memory cell small; and if the first memory cell is the second state, the parallel channel charge loss of the second memory cell is large. Therefore, in a stage of verifying the second memory cell in the present disclosure, the programmed state of the first memory cell is lower, and the discharge duration of the sensing node is longer, so that the second memory cell stores more charges, to compensate for impact of the large parallel channel charge loss on data retainability, thereby improving the data retention performance of the memory device.

In some examples, the first latch circuit is coupled to the charge circuit, and the charge circuit comprises a first charge sub-circuit and a second charge sub-circuit. A first end of the first charge sub-circuit is coupled to the first end of the charge circuit, and a second end of the first charge sub-circuit is coupled to the second end of the charge circuit. A first end of the second charge sub-circuit is coupled to the first end of the charge circuit, and a second end of the second charge sub-circuit is coupled to the second end of the charge circuit. When the programmed state of the first memory cell is the first state, the first charge sub-circuit charges the sensing node; and when the programmed state of the first memory cell is the second state, the second charge sub-circuit charges the sensing node. When the charge circuit stops charging the sensing node, the sensing node starts discharging. Moments at which the first charge sub-circuit and the second charge sub-circuit stop charging the sensing node are different, so that moments at which the sensing node starts discharging are different, and eventually the discharge duration of the sensing node varies. The moment at which the first charge sub-circuit stops charging the sensing node is later than the moment at which the second charge sub-circuit stops charging the sensing node. That is, the second charge sub-circuit stops charging the sensing node earlier than the first charge sub-circuit. Therefore, discharge duration (the first duration) of the sensing node when in the first state is less than discharge duration (the second duration) of the sensing node when in the second state.

In some examples, the first charge sub-circuit comprises a first transistor and a second transistor; a first end of the first transistor is coupled to the first end of the first charge sub-circuit, a second end of the first transistor is coupled to a first end of the second transistor, a second end of the second transistor is coupled to the second end of the first charge sub-circuit, and a control end of the second transistor is coupled to an output end of the first latch circuit; the peripheral circuit further comprises a control logic circuit, and a control end of the first transistor is coupled to a first output end of the control logic circuit; when the programmed state of the first memory cell is the first state, the second transistor is turned on; and the control logic circuit is configured to: control the first transistor to be turned on, so that the first charge sub-circuit charges the sensing node; or, control the first transistor to be turned off, so that the first charge sub-circuit stops charging the sensing node. In the present disclosure, the on or off of the second transistor is controlled through the programmed state of the first memory cell. When the programmed state of the first memory cell is the first state to make the second transistor turned on, the control logic circuit achieves charging of the sensing node by the first charge sub-circuit by controlling the first transistor.

In some examples, the second charge sub-circuit comprises a third transistor, a first end of the third transistor is coupled to the first end of the second charge sub-circuit, a second end of the third transistor is coupled to the second end of the second charge sub-circuit, and a control end of the third transistor is coupled to a second output end of the control logic circuit; when the programmed state of the first memory cell is the second state, the second transistor is turned off; and the control logic circuit is configured to: control the third transistor to be turned on, so that the second charge sub-circuit charges the sensing node; or, control the third transistor to be turned off, so that the second charge sub-circuit stops charging the sensing node. In the present disclosure, the on or off of the second transistor is controlled through the programmed state of the first memory cell. When the programmed state of the first memory cell is the second state to make the second transistor turned off, the control logic circuit achieves charging of the sensing node by the second charge sub-circuit by controlling the third transistor. The third transistor is first turned off, and then the first transistor is turned off. In this way, it is achieved that the second charge sub-circuit stops charging the sensing node before the first charge sub-circuit.

In some examples, the first latch circuit is coupled to the discharge circuit, and the discharge circuit comprises a first discharge sub-circuit and a second discharge sub-circuit. A first end of the first discharge sub-circuit is coupled to the first end of the discharge circuit, and a second end of the first discharge sub-circuit is coupled to the second end of the discharge circuit. A first end of the second discharge sub-circuit is coupled to the first end of the discharge circuit, and a second end of the second discharge sub-circuit is coupled to the second end of the discharge circuit. When the programmed state of the first memory cell is the first state, the first discharge sub-circuit discharges the sensing node; and when the programmed state of the first memory cell is the second state, the second discharge sub-circuit discharges the sensing node. Moments at which the first discharge sub-circuit and the second discharge sub-circuit stop discharging the sensing node are different, so that the discharge duration of the sensing node varies. The moment at which the second discharge sub-circuit stops discharging the sensing node is later than the moment at which the first discharge sub-circuit stops discharging the sensing node. That is, the first discharge sub-circuit stops discharging the sensing node earlier than the second discharge sub-circuit. Therefore, discharge duration (the first duration) of the sensing node when in the first state is less than discharge duration (the second duration) of the sensing node when in the second state.

In some examples, the second discharge sub-circuit comprises a fourth transistor and a fifth transistor, a first end of the fourth transistor is coupled to the first end of the first discharge sub-circuit, a second end of the fourth transistor is coupled to a first end of the fifth transistor, a second end of the fifth transistor is coupled to the second end of the first discharge sub-circuit, and a control end of the fifth transistor is coupled to the output end of the first latch circuit; the peripheral circuit further comprises a control logic circuit, and a control end of the fourth transistor is coupled to a third output end of the control logic circuit; and when the programmed state of the first memory cell is the second state, the fifth transistor is turned on, and the control logic circuit is configured to: control the fourth transistor to be turned on, so that the second discharge sub-circuit discharges the sensing node; or, control the fourth transistor to be turned off, so that the second discharge sub-circuit stops discharging the sensing node. In the present disclosure, the on or off of the fifth transistor is controlled through the programmed state of the first memory cell. When the programmed state of the first memory cell is the second state to make the fifth transistor turned on, the control logic circuit achieves discharging of the sensing node by the second discharge sub-circuit by controlling the fourth transistor.

In some examples, the first discharge sub-circuit comprises a sixth transistor, a first end of the sixth transistor is coupled to the first end of the first discharge sub-circuit, and a second end of the sixth transistor is coupled to the second end of the first discharge sub-circuit; a control end of the sixth transistor is coupled to a fourth output end of the control logic circuit; and when the programmed state of the first memory cell is the first state, the fifth transistor is turned off, and the control logic circuit is configured to: control the sixth transistor to be turned on, so that the first discharge sub-circuit discharges the sensing node; or, control the sixth transistor to be turned off, so that the first discharge sub-circuit stops discharging the sensing node. In the present disclosure, the on or off of the fifth transistor is controlled through the programmed state of the first memory cell. When the programmed state of the first memory cell is the first state to make the fifth transistor turned off, the control logic circuit achieves discharging of the sensing node by the first discharge sub-circuit by controlling the sixth transistor. The sixth transistor is first turned off, and then the fourth transistor is turned off. In this way, it is achieved that the first discharge sub-circuit stops discharging the sensing node before the second discharge sub-circuit.

In a second aspect, an operation method of a memory device is provided. The memory device comprises a memory array and a peripheral circuit coupled to the memory array; and the peripheral circuit comprises a page buffer circuit, and the operation method comprises: latching a programmed state of a first memory cell in the memory array; in a stage of performing program verification on a second memory cell in the memory array, discharging a sensing node in the page buffer circuit, wherein discharge duration of the sensing node is related to the programmed state of the first memory cell; and the first memory cell and the second memory cell are adjacent and are coupled to a same bit line, and the sensing node is coupled to the bit line; and after the discharge duration, latching, according to a voltage value of the sensing node, information of whether the second memory cell passes the program verification.

In some examples, discharging the sensing node in the page buffer circuit comprises: charging the sensing node, wherein the sensing node is coupled to a second end of a charge circuit, and a first end of the charge circuit is configured to input a supply voltage; applying a bit line voltage to the bit line, wherein the bit line is coupled to a first end of a discharge circuit, and a second end of the discharge circuit is coupled to the sensing node; stopping charging the sensing node, so that the sensing node starts discharging; and stopping discharging the sensing node, so that the sensing node stops discharging.

In some examples, the programmed state of the first memory cell comprises a first state and a second state, and a threshold voltage of the first memory cell when in the first state is greater than a threshold voltage when in the second state; when the programmed state of the first memory cell is the first state, the discharge duration of the sensing node is first duration; and the discharge duration of the sensing node is equal to a difference between a moment of stopping discharging the sensing node and a moment of stopping charging the sensing node; and when the programmed state of the first memory cell is the second state, the discharge duration is second duration; and the first duration is less than the second duration.

In some examples, that the discharge duration of the sensing node is related to the programmed state of the first memory cell comprises: the moment of stopping charging the sensing node is related to the programmed state of the first memory cell, wherein when the programmed state of the first memory cell is the first state, the first charge sub-circuit in the charge circuit charges the sensing node; when the programmed state of the first memory cell is the second state, the second charge sub-circuit in the charge circuit charges the sensing node; and a moment at which the first charge sub-circuit stops charging the sensing node is later than a moment at which the second charge sub-circuit stops charging the sensing node.

In some examples, when the programmed state of the first memory cell is the first state, a second transistor in the first charge sub-circuit is turned on, and that the first charge sub-circuit charges the sensing node comprises: turning on a first transistor in the first charge sub-circuit, so that the first charge sub-circuit charges the sensing node; and turning off the first transistor, so that the first charge sub-circuit stops charging the sensing node, wherein a first end of the first transistor is configured to input the supply voltage, a second end of the first transistor is coupled to a first end of the second transistor, and a second end of the second transistor is coupled to the sensing node.

In some examples, when the programmed state of the first memory cell is the second state, the second transistor in the first charge sub-circuit is turned off, and that the second charge sub-circuit charges the sensing node comprises: turning on a third transistor in the second charge sub-circuit, so that the second charge sub-circuit charges the sensing node; and turning off the third transistor, so that the second charge sub-circuit stops charging the sensing node, wherein a first end of the third transistor is configured to input the supply voltage, and a second end of the third transistor is configured to be coupled to the sensing node.

In some examples, that the moment at which the first charge sub-circuit stops charging the sensing node is later than the moment at which the second charge sub-circuit stops charging the sensing node comprises: first turning off the third transistor, and then turning off the first transistor.

In some examples, that the discharge duration of the sensing node is related to the programmed state of the first memory cell comprises: the moment of stopping discharging the sensing node is related to the programmed state of the first memory cell, wherein when the programmed state of the first memory cell is the first state, the first discharge sub-circuit in the discharge circuit discharges the sensing node; and when the programmed state of the first memory cell is the second state, the second discharge sub-circuit in the discharge circuit discharges the sensing node; and a moment at which the second discharge sub-circuit stops discharging the sensing node is later than a moment at which the first discharge sub-circuit stops discharging the sensing node.

In some examples, when the programmed state of the first memory cell is the second state, a fifth transistor in the second discharge sub-circuit is turned on, and that the second discharge sub-circuit discharges the sensing node comprises: turning on a fourth transistor in the second discharge sub-circuit, so that the second discharge sub-circuit discharges the sensing node; and turning off the fourth transistor, so that the second discharge sub-circuit stops discharging the sensing node, wherein a first end of the fourth transistor is coupled to the bit line, a second end of the fourth transistor is coupled to a first end of the fifth transistor, and a second end of the fifth transistor is coupled to the sensing node.

In some examples, when the programmed state of the first memory cell is the first state, the fifth transistor in the second discharge sub-circuit is turned off, and that the first discharge sub-circuit discharges the sensing node comprises: turning on a sixth transistor in the first discharge sub-circuit, so that the first discharge sub-circuit discharges the sensing node; and turning off the sixth transistor, so that the first discharge sub-circuit stops discharging the sensing node, wherein a first end of the sixth transistor is coupled to the bit line, and a second end of the sixth transistor is coupled to the sensing node.

In some examples, that the moment at which the second discharge sub-circuit stops discharging the sensing node is later than the moment at which the first discharge sub-circuit stops discharging the sensing node comprises: first turning off the sixth transistor, and then turning off the fourth transistor.

In some examples, the operation method further comprises: in the stage of performing the program verification on the second memory cell in the memory array, discharging the sensing node for multiple times; wherein the discharge duration is gradually increased. In this way, in a next program cycle, for the second memory cell with different threshold voltages, different bit line voltages may be applied, to achieve accurate programming of the second memory cell.

In a third aspect, a memory system is provided. The memory system comprises a memory controller and a memory device of any example in the above first aspect. The memory controller is configured to control the memory device.

In a fourth aspect, a computer readable storage medium is provided, which stores a computer executable instruction that, after being executed, can achieve a method of any example in the above second aspect.

In a fifth aspect, a computer apparatus is provided, which comprises a processor, and a readable storage medium coupled with the processor, wherein the readable storage medium stores an executable instruction that, when being executed by the processor, can achieve a method of any example in the above second aspect.

It may be understood that the technical effect of the second aspect to the fifth aspect may be referred to that of the first aspect or any implementation thereof, which is no longer repeated herein.

BRIEF DESCRIPTION OF THE DRAWINGS

In order to illustrate the technical solution in the present disclosure more clearly, the drawings to be used in some examples of the present disclosure will be briefly introduced below. Apparently, the drawings in the following description are only drawings of some examples of the present disclosure. Those of ordinary skills in the art may also obtain other drawings according to these drawings. In addition, the drawings in the following description may be regarded as schematic diagrams, instead of limiting an actual size of a product, an actual flow of a method, an actual timing of a signal, etc. involved in the examples of the present disclosure.

Figure 1:
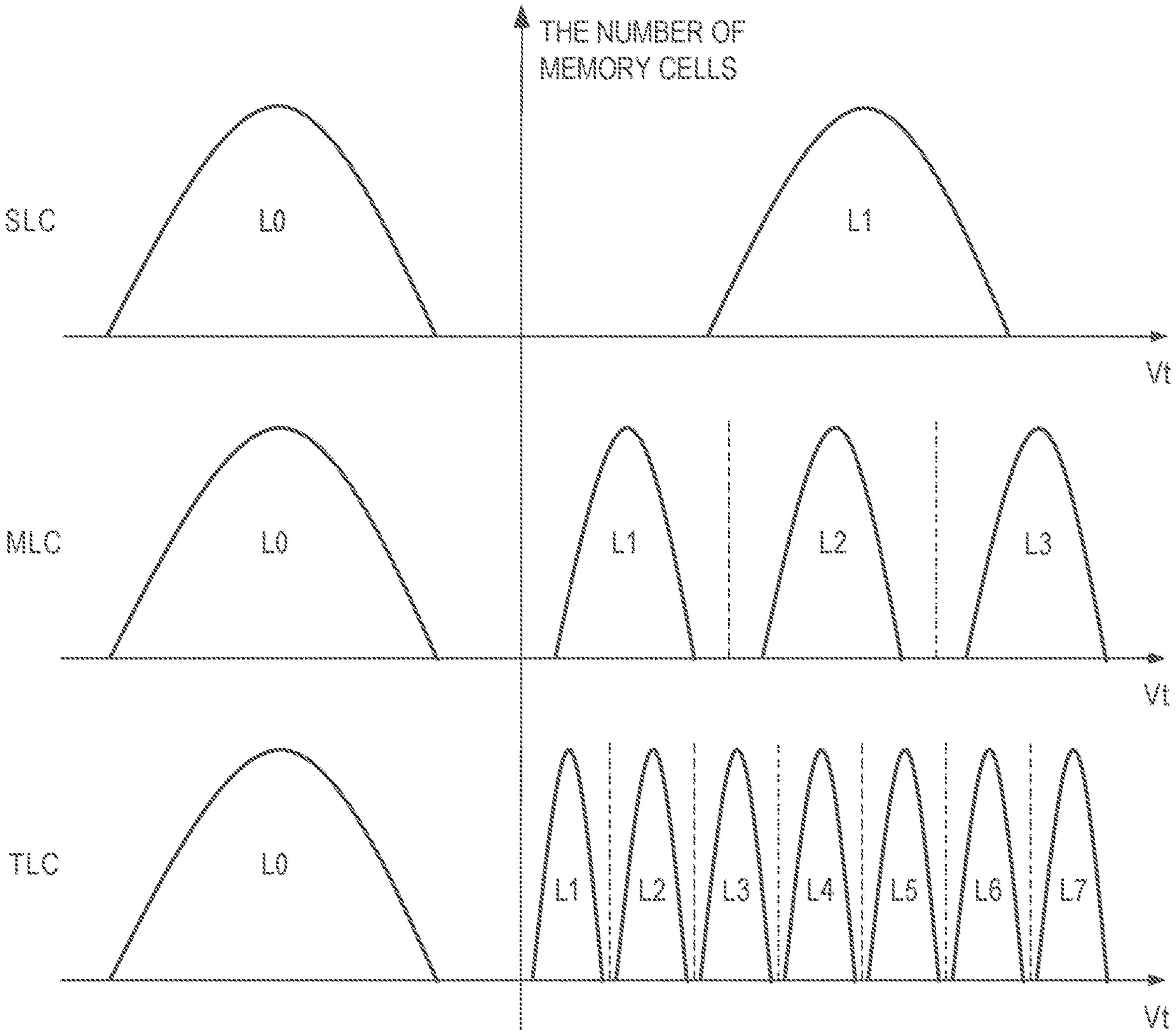
FIG. 1 is a schematic diagram of a threshold voltage distribution of a memory cell provided by examples of the present disclosure.

Reference numerals: 100. memory system; 110. memory controller; 120. memory device; 200. memory array; 210. memory cell block; 220. memory cell string; 221. top select transistor; 222. dummy memory cell; 223. memory cell; 224. bottom select transistor; 300. peripheral circuit; 310. I/O interface; 320. control logic circuit; 330. row decoder; 340. voltage generator; 350. column decoder; 360. data bus; 370. register; 380. page buffer; 410. memory stack layer; 411. gate conductive layer; 412. dielectric layer; 420. substrate; 430. top select line; 440. word line; 450. ground select line; 500. first latch circuit; 510. first stage inverter; 520. second stage inverter; 530. seventh transistor; 540. eighth transistor; 550. ninth transistor; 600. charge and discharge circuit; 610. charge circuit; 611. first transistor; 612. second transistor; 613. third transistor; 620. discharge circuit; 621. fourth transistor; 622. fifth transistor; 623. sixth transistor; 700. second latch circuit; 710. third stage inverter; 720. fourth stage inverter; 730. tenth transistor; 740. eleventh transistor; 750. twelfth transistor; 760. thirteenth transistor; 810. fourteenth transistor; 820. fifteenth transistor; and 830. sixteenth transistor.

DETAILED DESCRIPTION

The technical features in some examples of the present disclosure will be described below clearly and completely in conjunction with FIG. 1 to FIG. 19. Apparently, the examples described are only part of, but not all of, the examples of the present disclosure. All other examples obtained by those of ordinary skill in the art based on the examples provided by the present disclosure shall fall in the scope of protection of the present disclosure.

Unless otherwise specified in the context, throughout the specification and the claims, the term “comprise” is interpreted as an open and inclusive meaning, e.g., “comprising, but not limited to”. In the description of the specification, the terms “one example”, “some examples”, “example implementation”, “in an example”, or “some examples” indicate that example features, structures, materials, or characteristics related to the implementation or the example are comprised in at least one implementation or example of the present disclosure. The schematic representation of the above terms not necessarily refers to the same implementation or example. Furthermore, these example features, structures, materials, or characteristics may be comprised in one or more implementations or examples in any suitable manner.

In the following, the terms "first" and "second" are only for the purpose of description, and cannot be construed as indicating or implying relative importance or implicitly indicating the number of indicated technical features. Thus, features defined by "first" and "second" may explicitly or implicitly comprise one or more of such features. In the description of the examples of the present disclosure, "a plurality of" means two or more, unless otherwise stated.

In describing some examples, expressions of "coupled" and derivatives thereof may be used. For example, the term "coupled" may be used in the description of some examples to indicate that two or more components have a direct physical contact or an electrical contact. In this case, "coupled" may be also described as "connected". Moreover, the term "coupled" may also mean that two or more components have no direct contact with each other, but still collaborate or interact with each other. The examples disclosed herein are not necessarily limited to the content herein.

The use of "configured to" herein means open and inclusive language, and does not exclude an apparatus suitable for performing or configured to perform additional tasks or operations.

A flash is a non-volatile memory device, comprising a plurality of electrically erasable and reprogrammable memory cells. A program operation may make a memory cell store charges, and an erase operation may remove charges that are already stored in a memory cell.

An electrical field generated from charges can affect a threshold voltage (Vt) of a memory cell. Typically, when the memory cell stores more charges, the threshold voltage of the memory cell is larger, and a programmed level is higher. As shown in FIG. 1, according to different threshold voltage distributions, a memory cell may be classified into a single-level cell (SLC) type, a multi-level cell (MLC) type, a triple-level cell (TLC) type, etc. An SLC has two programmed levels L0-L1. An MLC has four programmed levels L0-L3. A TLC has eight programmed levels L0-L7.

When a read operation is performed, a programmed level of a memory cell may be identified through a read voltage, so as to read out data. Taking SLC as an example, when the threshold voltage of the memory cell is greater than the read voltage, the programmed level is identified as L1, so as to read out data "0". When the threshold voltage of the memory cell is less than the read voltage, the programmed level is identified as L0, so as to read out data "1".

Figure 2:
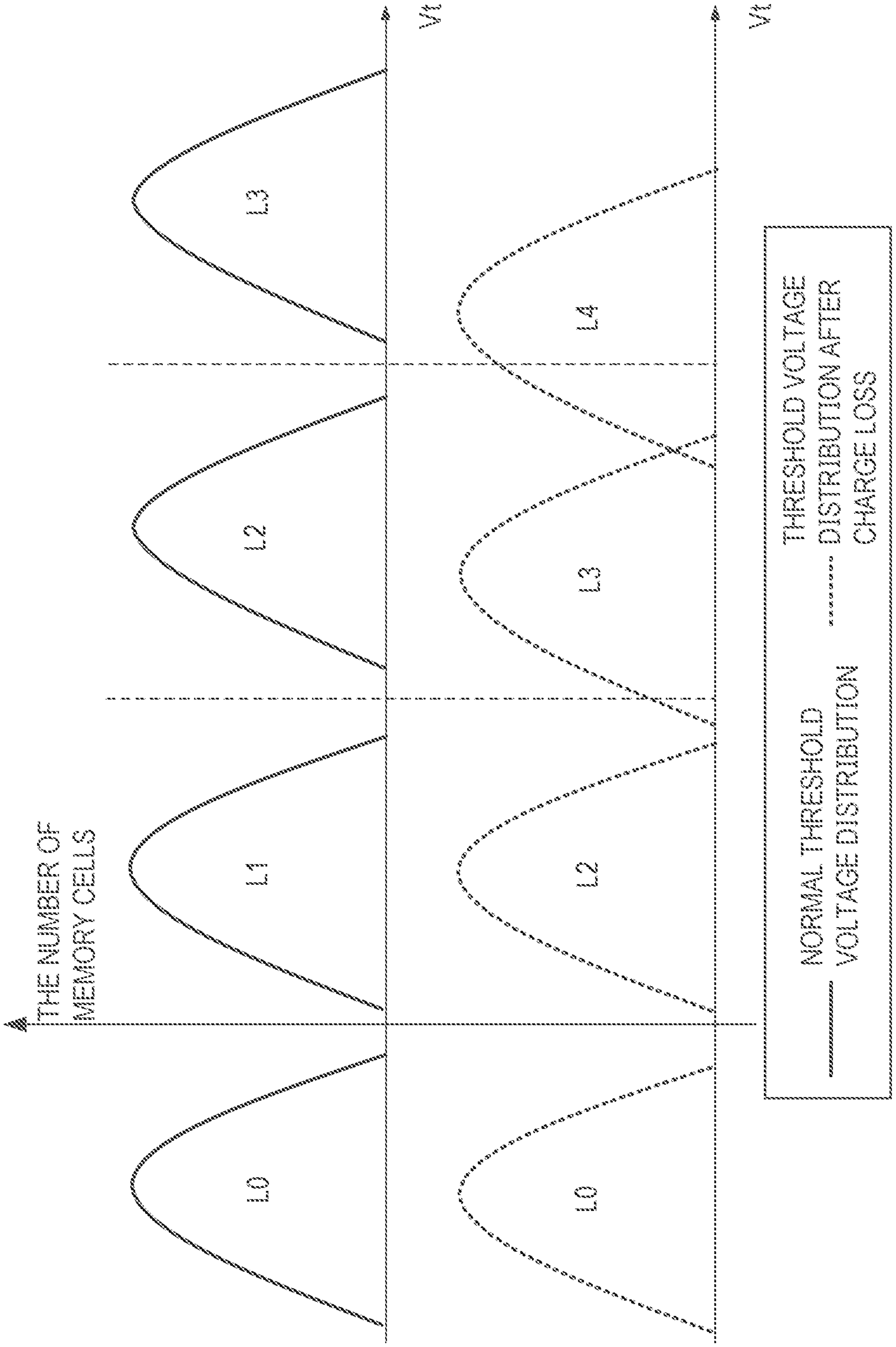
FIG. 2 is a schematic diagram of comparison between a normal threshold distribution and a threshold voltage distribution after a charge loss provided by examples of the present disclosure.

A charge loss of a memory cell is one of the factors that affects data retention performance of the memory device. As shown in FIG. 2, a charge loss reduces a threshold voltage of a memory cell. It is reflected in a threshold voltage distribution diagram that the threshold voltage moves to the left, and a threshold voltage distribution is broadened. As a result, after a long time of data retention, it becomes difficult to identify a programmed level of a memory cell through the read voltage, to eventually cause data corruption.

Figure 3:
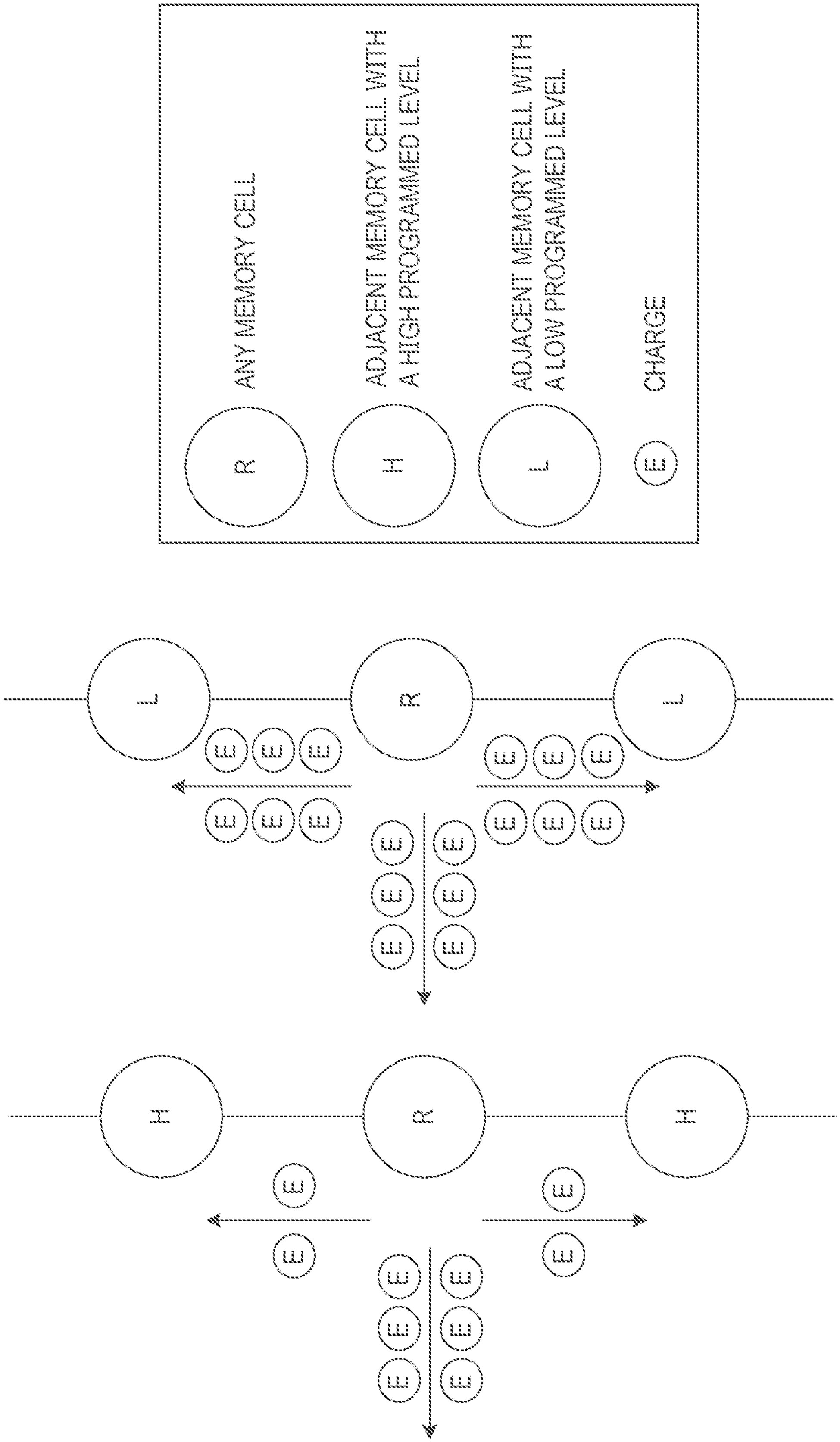
FIG. 3 is a schematic diagram of a result of impact on a parallel channel charge loss of any memory cell by a programmed state of an adjacent memory cell provided by examples of the present disclosure.

The charge loss mainly comprises a vertical channel charge loss and a parallel channel charge loss. The vertical channel charge loss is related to the threshold voltage of the memory cell. When the threshold voltage is larger, the vertical channel charge loss of the memory cell is severer. The parallel channel charge loss not only is related to the threshold voltage of the memory cell, but also is related to a programmed level of an adjacent memory cell of the memory cell. As shown in FIG. 3, for any memory cell, when an adjacent memory cell is at a high programmed level, the parallel channel charge loss of the memory cell is smaller; and when an adjacent memory cell is at a low programmed level, the parallel channel charge loss of the memory cell is larger.

In order to compensate for the impact of a large parallel channel charge loss on the data retention performance of the memory device, in a verify stage after program, a plurality of verify voltages are used for each programmed level to perform verification. An MLC is taken as an example for description. A memory cell string comprises a programmed first memory cell and an unprogrammed second memory cell. The first memory cell and the second memory cell are adjacent. During verification of the second memory cell, if a programmed level of the adjacent first memory cell is L0, a verify voltage Vvfy_1 is used to perform verification. If the programmed level of the adjacent first memory cell is L1, a verify voltage Vvfy_2 is used to perform verification. If the programmed level of the adjacent first memory cell is L2, a verify voltage Vvfy_3 is used to perform verification. If the programmed level of the adjacent first memory cell is L3, a verify voltage Vvfy_4 is used to perform verification. The verify voltage Vvfy_1 is greater than verify voltage Vvfy_2, which is greater than verify voltage Vvfy_3, which is greater than verify voltage Vvfy_4.

That is, when the programmed level of the programmed first memory cell is lower, a larger verify voltage of the plurality of verify voltages is used to verify the second memory cell. When the verify voltage is larger, in a page buffer coupled with the second memory cell, a sensing node (SO) releases more charges within sensing duration Tsense, so as to make a voltage of the sensing node lower. If the voltage of the sensing node is less than a threshold voltage, the second memory cell fails to pass verification. Further, in a next program cycle, the second memory cell may continue to be programmed, to increase the threshold voltage of the second memory cell (the second memory cell stores more charges). Therefore, at same programmed level, compared with a memory cell with a small parallel channel charge loss, a larger verify voltage is used for a memory cell with a severe parallel channel charge loss to perform verification, so that after a program operation, the memory cell with a severe parallel channel charge loss can store more charges. Because more charges are stored after the program operation, even if the parallel channel charge loss is severe, the memory cell can retain data without corruption for a long time, so that the data retention performance of the memory device is improved.

Further, according to the programmed level of the first memory cell, the first memory cell may be classified into a plurality of programmed states. For example, the first memory cell is classified into two programmed states, that is, classified into a first state and a second state. In some implementations, if the programmed level of the first memory cell is L2 or L3, the programmed state of the first memory cell may be classified into the first state. If the programmed level of the first memory cell is L0 or L1, the programmed state of the first memory cell may be classified into the second state. During verification of the second memory cell, if the adjacent first memory cell is in the first state, the verify voltage Vvfy_1 is used to perform verification; and if adjacent first memory cell is in the second state, the verify voltage Vvfy_2 may be used to perform verification. In this way, a number of verify voltages is reduced, and program duration is shortened as much as possible while improving the data retention performance of the memory device. However, for a same programmed level, a plurality of (two or more) verify voltages are sequentially used to perform repeated verification (for example, the verify voltage Vvfy_1 and the verify voltage Vvfy_2 are sequentially applied), program duration of the memory cell is still greatly increased.

In the examples of the present disclosure, a first latch circuit used to latch the programmed level of the first memory cell is disposed in the page buffer, the first latch circuit is coupled to the sensing node and a charge and discharge circuit configured to discharge the sensing node. During verification of the second memory cell adjacent to the first memory cell, discharge duration of the sensing node by the charge and discharge circuit is controlled according to the programmed level latched by the first latch circuit. At a same verify voltage, when the discharge duration is longer, the sensing node releases more charges, so as to make a voltage of the sensing node lower. If the voltage of the sensing node is less than a threshold voltage, the memory cell fails to pass verification. Further, in a next program cycle, the memory cell may continue to be programmed. Therefore, for the same programmed level, one verify voltage is used to complete verification of the second memory cell in the present disclosure, so that program duration is greatly shortened while the data retention performance of the memory device is improved.

Figure 4:
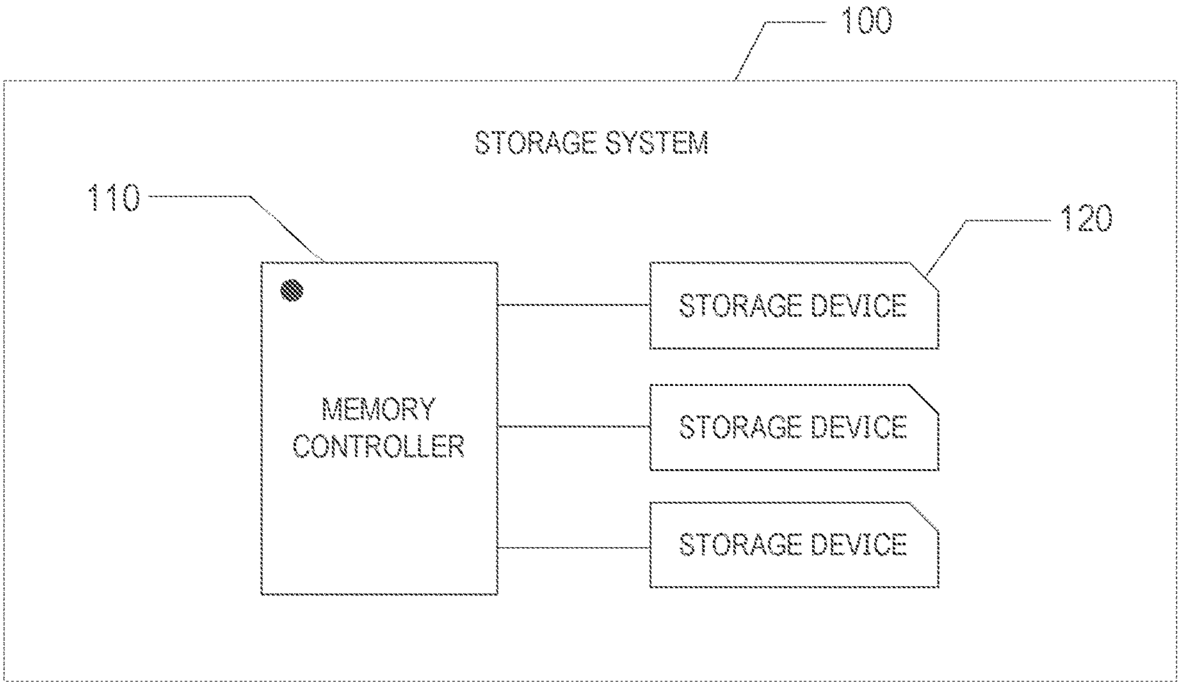
FIG. 4 is a schematic structural diagram of a memory system provided by examples of the present disclosure.

As shown in FIG. 4, examples of the present disclosure provide a memory system 100. The memory system 100 comprises a memory controller 110 and a memory device 120. The memory controller 110 is configured to store data into the memory device 120 or read data from the memory device 120. The memory system 100 may be applied to and packaged into various types of electronic apparatuses, for example, a mobile phone (e.g., a cellphone), a desktop computer, a tablet computer, a notebook computer, a server, a vehicle apparatus, a gaming console, a printer, a positioning apparatus, a wearable apparatus, a smart sensor, a mobile power supply, a virtual reality (VR) apparatus, an augmented reality (AR) apparatus, a server or any electronic apparatus that can store data.

Of course, the memory controller 110 may also perform any other suitable functions, such as formatting the memory device 120. For example, the memory controller 110 may communicate with an external apparatus (e.g., a host) through at least one of various interface protocols. The interface protocol may comprise at least one of a universal serial bus (USB) protocol, a multimedia card (MMC) protocol, a peripheral component interconnect (PCI) protocol, a PCI-Express (PCI-E) protocol, an advanced technology attachment (ATA) protocol, a serial ATA protocol, a parallel ATA protocol, a small computer system interface (SCSI) protocol, an enhanced small disk interface (ESDI) protocol, and an integrated drive electronics (IDE) protocol.

Figure 5:
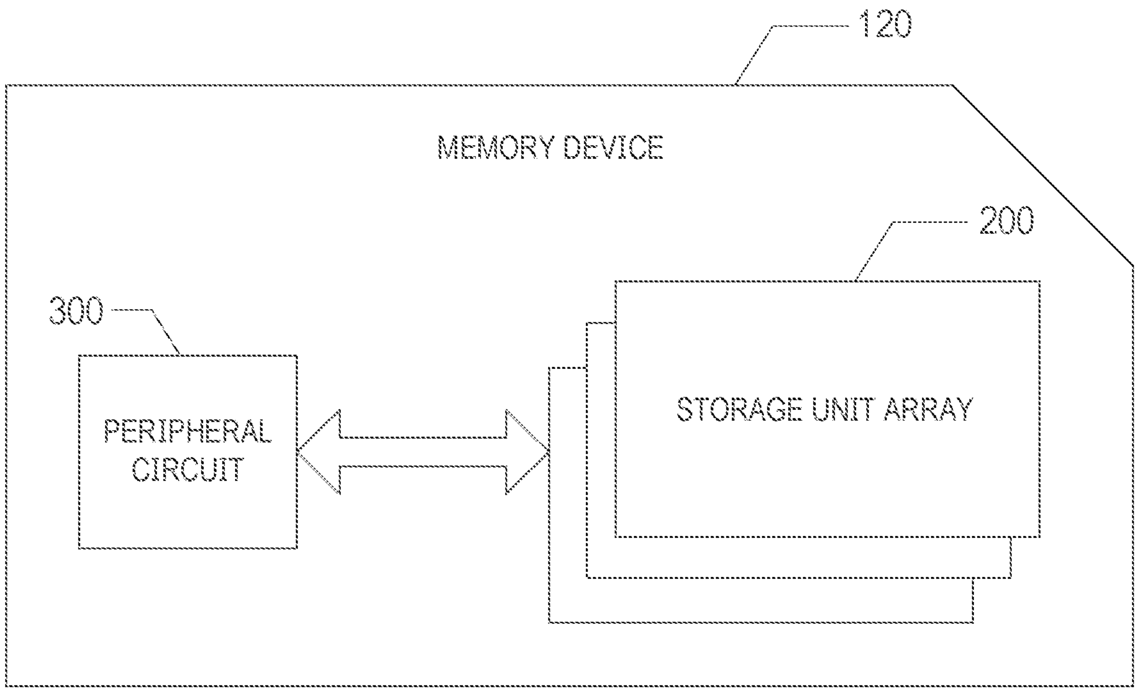
FIG. 5 is a schematic structural diagram of a memory device provided by examples of the present disclosure.

In an example, as shown in FIG. 5, the memory device 120 comprises a memory array 200 and a peripheral circuit 300 coupled to the memory array 200.

Figure 6:
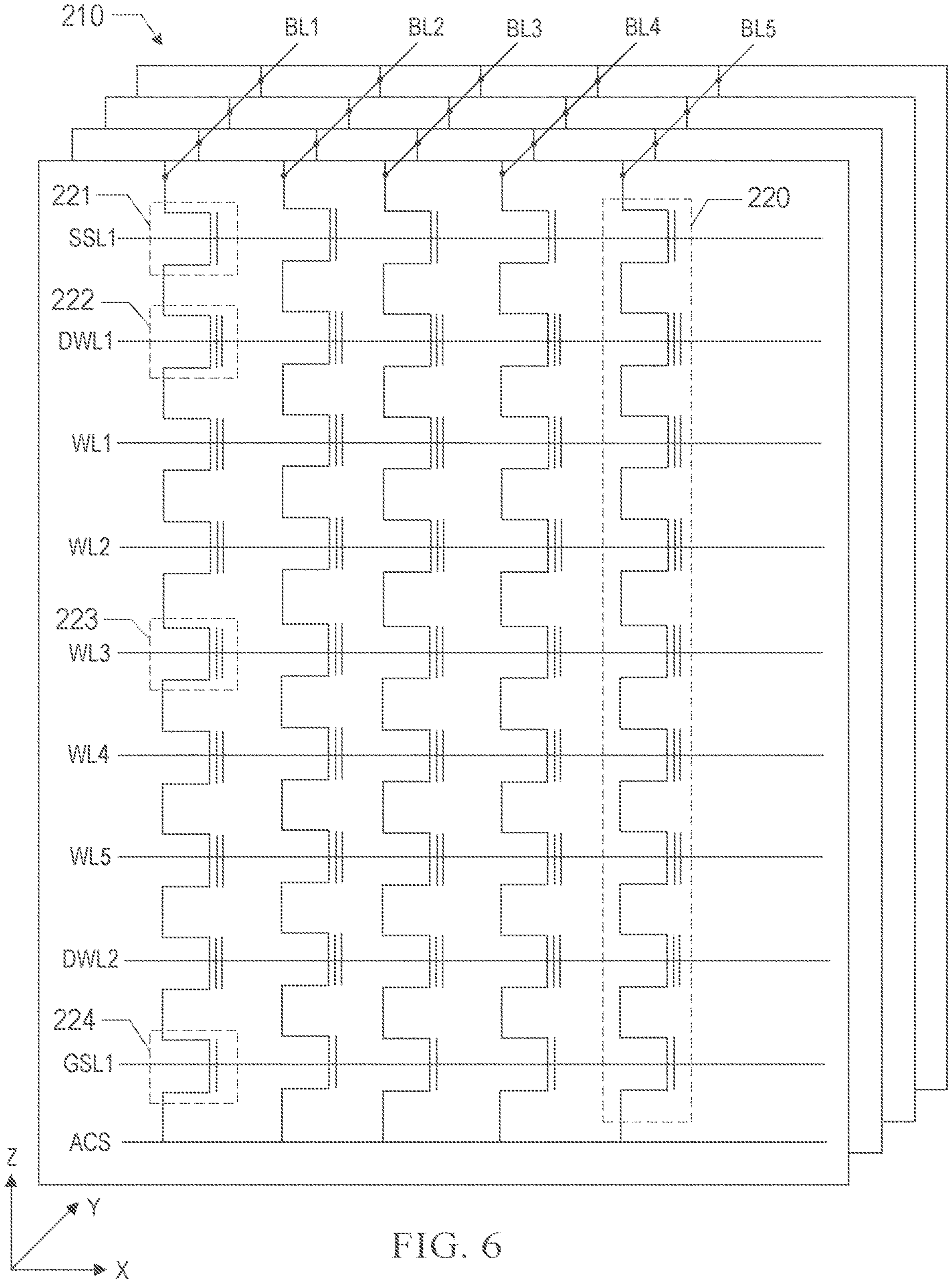
FIG. 6 is a schematic structural diagram of a memory cell block provided by examples of the present disclosure.

In a three-dimensional (3D) NAND memory device 120, the memory array 200 may comprise a plurality of memory cell blocks 210. As shown in FIG. 6, each memory cell block 210 may comprise a plurality of memory cell strings 220. Each memory cell string 220 may comprise a top select transistor (e.g., top select gate (TSG)) 221, a dummy (DMY) memory cell 222, a plurality of memory cells 223, and a bottom select transistor (e.g., bottom select gate (BSG)) 224 that are sequentially stacked in series. The memory cell 223 may be a floating gate transistor, or may be device such as a charge trap field effect transistor etc. that can store data.

Figure 7:
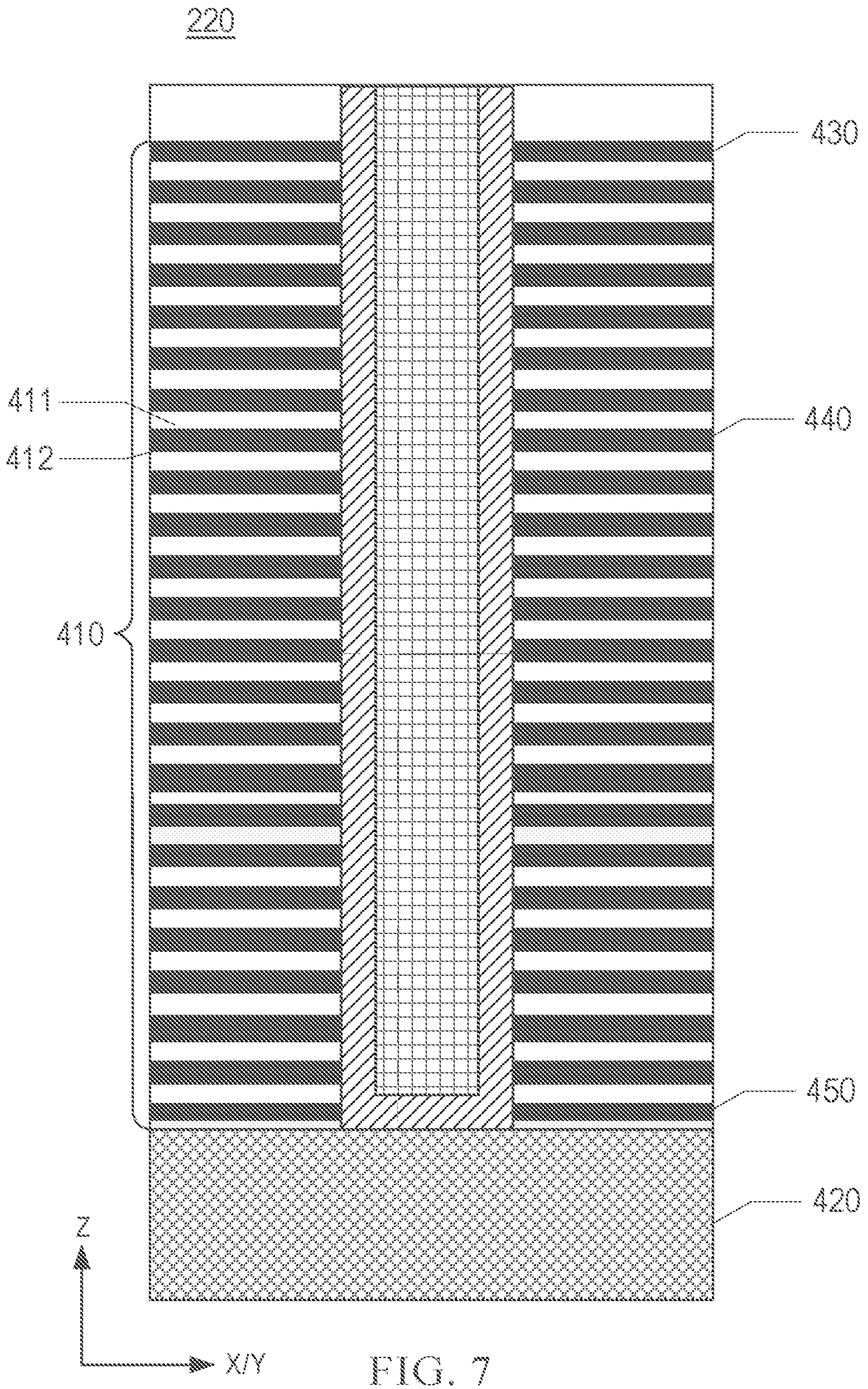
FIG. 7 is a partial cross-sectional view of a cross-section of a memory cell string provided by examples of the present disclosure.

FIG. 7 is a partial cross-sectional schematic view of a memory cell string 220 in the present disclosure. The memory cell string 220 may vertically extend through a memory stack layer 410 above a substrate 420. The substrate 420 may comprise silicon (e.g., monocrystalline silicon), silicon germanium (SiGe), gallium arsenide (GaAs), germanium (Ge), silicon on insulator (SOI), germanium on insulator (GOI), or any other suitable materials.

The memory stack layer 410 may comprise a gate conductive layer 411 and a dielectric layer 412 that are alternate. A number of the memory cells 223 in the memory cell string 220 May be determined by a number of the gate conductive layers 411 and a number of the dielectric layers 412 in the memory stack layer 410.

The gate conductive layer 411 may comprise conductive materials comprising, but not limited to, tungsten (W), cobalt (Co), copper (Cu), aluminum (Al), polysilicon, doped silicon, silicides, or any combination thereof. In some implementations, each gate conductive layer 411 comprises a metal layer, e.g., a tungsten layer. In some implementations, each gate conductive layer 411 comprises a doped polysilicon layer. Each gate conductive layer 411 may comprise a control gate surrounding the memory cell 223, and the gate conductive layer 411 at a top of the memory stack layer 410 can extend laterally as a top select line 430 (e.g., string select line (SSL)), the gate conductive layer 411 at a bottom of the memory stack layer 410 can extend laterally as a ground select line (GSL) 450, or the gate conductive layer 411 between the top select line 430 and the ground select line 450 can extend laterally as a word line (WL) 440.

It is to be understood that, although not shown in FIG. 7, additional components of the memory cell string 220 may be formed, comprising, but not limited to a gate line slit/source contact, a local contact, an interconnect layer, etc.

Figure 8:
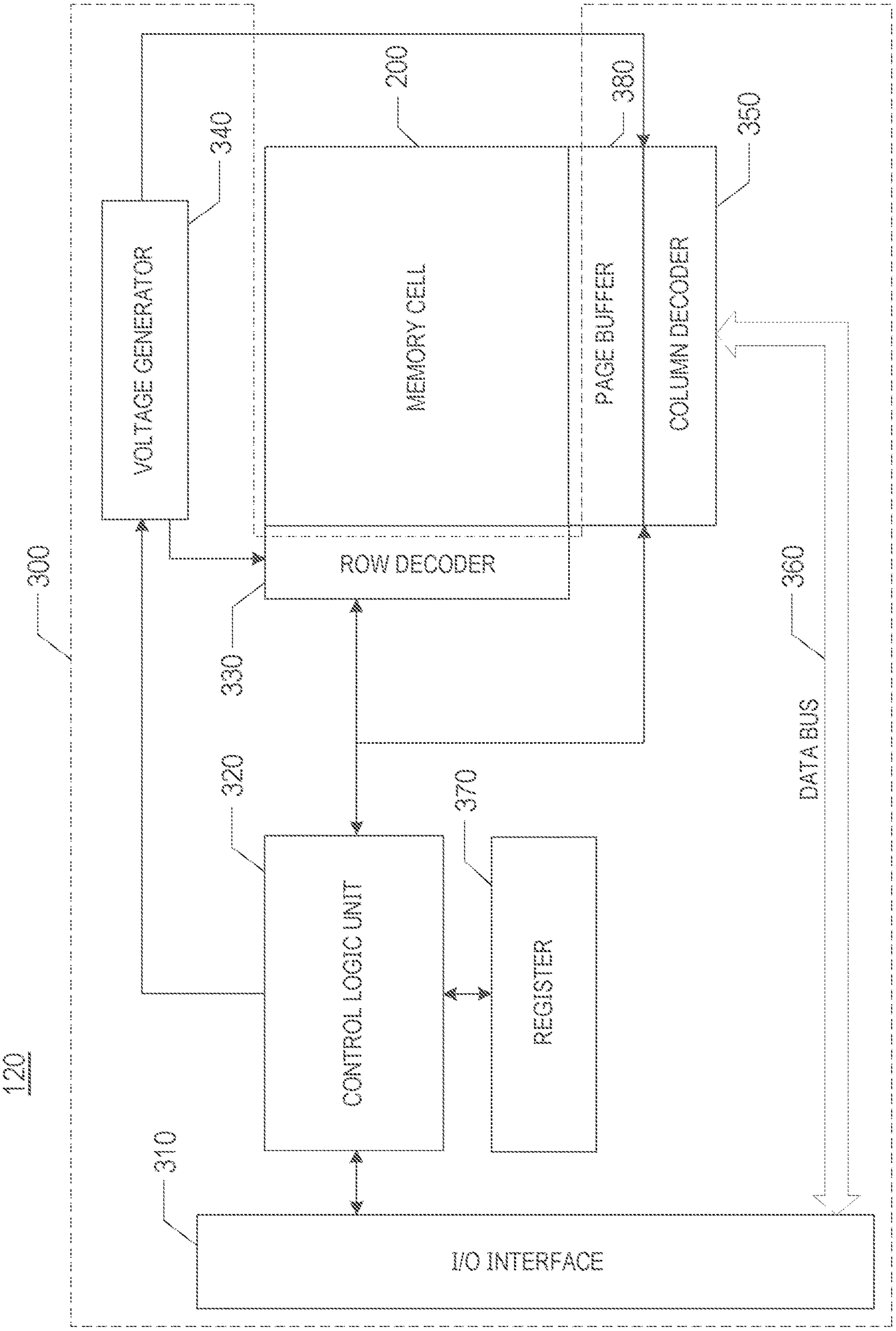
FIG. 8 is a schematic structural diagram of a memory device and a peripheral circuit provided by examples of the present disclosure.

The peripheral circuit 300 is configured to control the memory array 200. As shown in FIG. 8, the peripheral circuit 300 may comprise an I/O interface 310, a control logic circuit 320, a row decoder 330, a voltage generator 340, a column decoder 350, a data bus 360, a register 370, and a page buffer 380. It should be understood that in some examples, the peripheral circuit may further comprise an additional circuit not shown in FIG. 8. The memory array 200 may be coupled with the peripheral circuit 300 through a bit line, a common source line, the top select line 430, the word line 440, the ground select line 450, etc. For example, the bit line is coupled to the page buffer 380, and the word line 440 is coupled to the row decoder 330.

The I/O interface 310 may be coupled to the control logic circuit 320, and act as a control buffer to buffer and relay control commands received from the memory controller 110 (e.g., the memory controller 110 in FIG. 4) to the control logic circuit 320 and state information received from the control logic circuit 320 to the memory controller 110. The I/O interface 310 may be also coupled to the page buffer 380 via the data bus 360 and act as the data I/O interface 310 and a data buffer to buffer and relay the data to the memory array 200 or from the memory array 200.

The control logic circuit 320 may be coupled to the voltage generator 340, the page buffer 380, the column decoder 350, the row decoder 330, and the I/O interface 310, etc., and configured to control operations of various peripheral circuits 300. The control logic circuit 320 may generate an operation signal to control operations of the row decoder 330, the column decoder 350, the page buffer 380, and the voltage generator 340 in response to a command (CMD) or a control signal from the memory controller 110, wherein the command may be a program command, read command, etc.

The row decoder 330 may supply, in response to the operation signal of the control logic circuit 320, a voltage of the word line 440 generated from the voltage generator 340 to selected word lines 440 and unselected word lines 440 of the memory array 200. As described below in detail, the row decoder 330 is configured to perform program operations on the memory cells that are coupled to one or more selected word lines 440 in the memory array 200.

The voltage generator 340 may use an external power supply voltage or an internal power supply voltage to generate various voltages for performing the erase, program, read, and verify operations, etc. for the memory array 200, for example, a program voltage Vpgm, a pass voltage Vpass, a read voltage Vread, and a verify voltage Vvfy, etc. applied to the word line 440, and a program inhibit voltage Vinhibit, a program select voltage Vss, etc. applied to a bit line, and a combination thereof.

The column decoder 350 may select one or more memory cell strings 220 in the memory array 200 in response to the operation signal of the control logic circuit 320.

The register 370 may be coupled to the control logic circuit 320 and comprise a state register, a command register, and an address register for storing state information, command operation codes (OP codes), and command addresses for controlling the operations of each peripheral circuit 300.

The page buffer 380 may read data from the memory array 200 and program (write) data to the memory array 200 according to operation signals from the control logic circuit 320. In one example, the page buffer 380 may store program data (write data) to be programmed into the memory array 200. In another example, the page buffer 380 may perform program verify operations to ensure that the data has been properly programmed into the memory cells 223 that are coupled to the selected word lines 440. In yet another example, the page buffer 380 may also detect a low power signal from the bit lines that represents a data bit stored in the memory cells 223, and amplify a small voltage to a recognizable logic level in the read operation.

Figure 9:
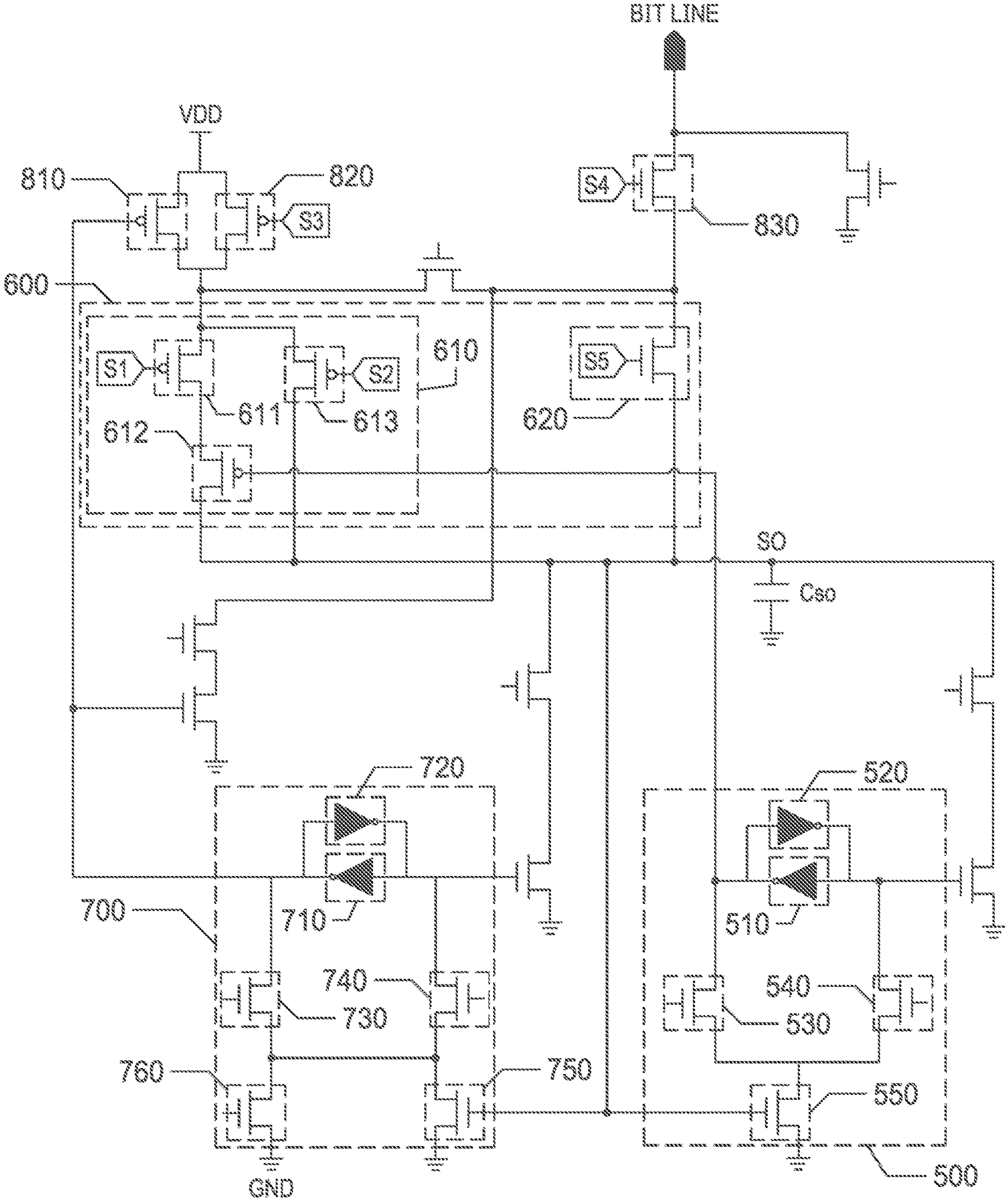
FIG. 9 is a schematic structural diagram of a page buffer provided by examples of the present disclosure.
Figure 10:
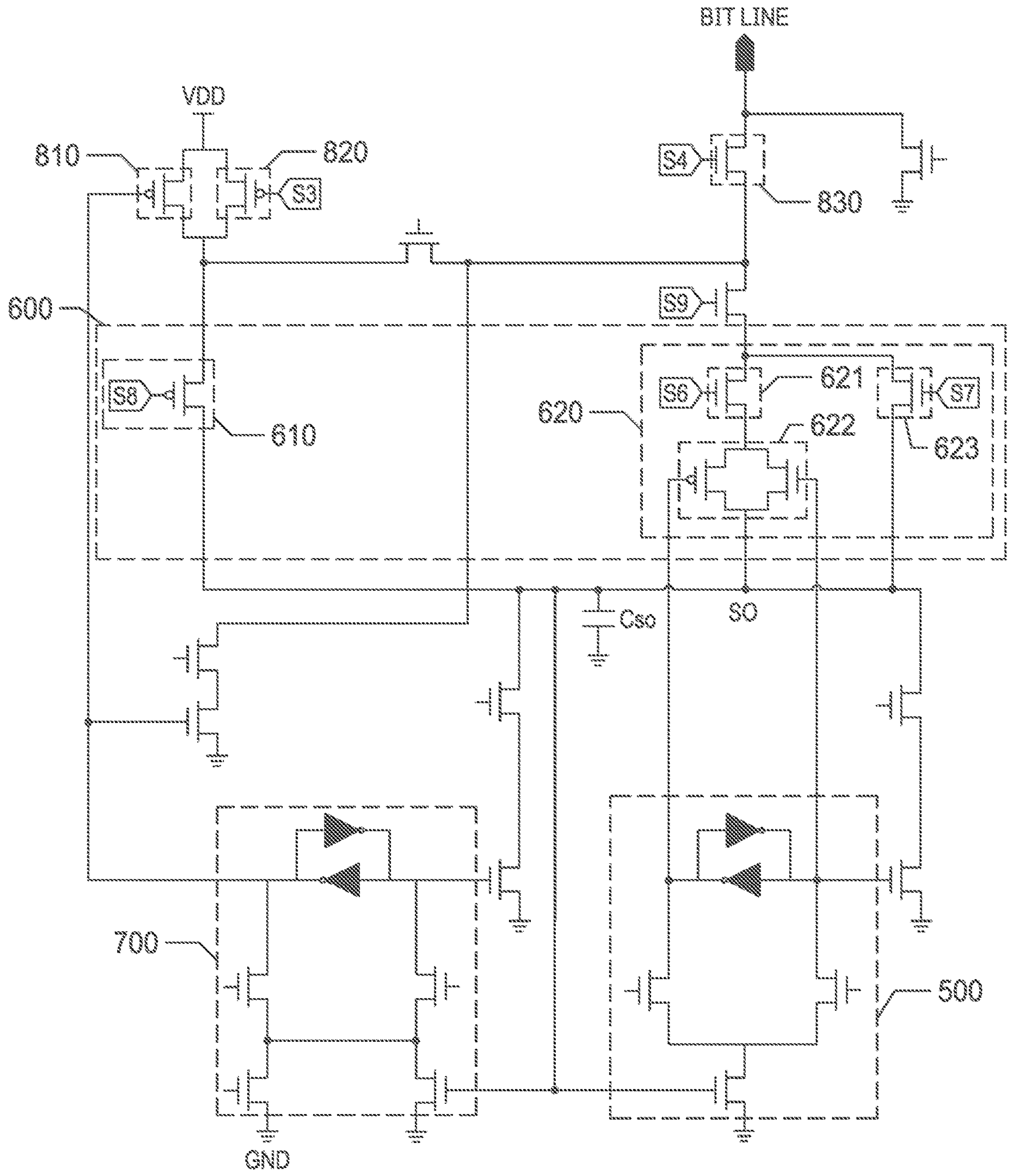
FIG. 10 is a schematic structural diagram of another page buffer provided by examples of the present disclosure.

As shown in FIG. 9 or FIG. 10, in the memory device provided by examples of the present disclosure, a circuit of the page buffer 380 may comprise a sensing node SO, a charge and discharge circuit 600, a first latch circuit 500, and a second latch circuit 700. The sensing node SO is coupled with the memory cell string 220 through a bit line. A capacitor Cso for storing charges may be disposed between the sensing node SO and a ground GND, or, between the sensing node SO and any one fixed potential. Of course, a parasitic capacitor for storing charges may be also formed between the sensing node SO and the ground GND, or, between the sensing node SO and any one fixed potential. A memory cell string 220 comprises a programmed first memory cell and an unprogrammed second memory cell. The first memory cell and the second memory cell are adjacent.

It should be understood that, the described "grounded" in the examples of the present disclosure may also be coupling to any one fixed potential.

In an example, the charge and discharge circuit 600 is coupled to the sensing node SO. The charge and discharge circuit 600 comprises a charge circuit 610 configured to charge the sensing node SO and a discharge circuit 620 configured to discharge the sensing node SO.

In the examples of the present disclosure, the first latch circuit 500 is configured to latch a programmed state of the first memory cell. In a stage of verifying the second memory cell, discharge duration of the sensing node SO is related to the programmed state of the first memory cell. The discharge duration of the sensing node SO is equal to a difference a moment at which the discharge circuit 620 stops discharging the sensing node SO and a moment at which the charge circuit 610 stops charging the sensing node SO. That is, the first latch circuit 500 may be coupled to the charge circuit 610, to control the moment at which the charge circuit 610 stops charging the sensing node SO; or, the first latch circuit 500 may be coupled to the discharge circuit 620, to control the moment at which the discharge circuit 620 stops discharging the sensing node SO; or, the first latch circuit 500 may further be simultaneously coupled to the charge circuit 610 and the discharge circuit 620, to simultaneously control the moment at which the discharge circuit 620 stops discharging the sensing node SO and the moment at which the charge circuit 610 stops charging the sensing node SO.

When the programmed state of the first memory cell is lower, the discharge duration of the sensing node SO during verification of the second memory cell is longer. In an example, the programmed state of the first memory cell comprises a first state and a second state, and a threshold voltage of the first memory cell when in the first state is greater than a threshold voltage when in the second state. When the programmed state of the first memory cell is the first state, the discharge duration of the sensing node SO is first duration; when the programmed state of the first memory cell is the second state, the discharge duration is second duration; and the first duration is less than the second duration. After the discharge duration, a voltage value of the sensing node SO is configured to determine whether the second memory cell passes program verification.

As shown in FIG. 9, in some examples, an output end of the first latch circuit 500 is coupled to the charge circuit 610. A first end of the charge circuit 610 is configured to input a supply voltage, and a second end of the charge circuit 610 is coupled to the sensing node SO.

In an example, the charge circuit 610 may comprise a plurality of charge sub-circuits. The plurality of charge sub-circuits correspond to a plurality of programmed states of the first memory cell. In an example, the charge circuit 610 comprises a first charge sub-circuit and a second charge sub-circuit.

A first end of the first charge sub-circuit is coupled to the first end of the charge circuit 610, and a second end of the first charge sub-circuit is coupled to the second end of the charge circuit 610. The first charge sub-circuit comprises a first transistor 611 and a second transistor 612. That is, a first end of the first transistor 611 is configured to input the supply voltage, a second end of the first transistor 611 is coupled to a first end of the second transistor 612, and a second end of the second transistor 612 is coupled to the sensing node SO. A control end of the first transistor 611 is coupled to a first output end of the control logic circuit 320, and a control end of the second transistor 612 is coupled to the output end of the first latch circuit 500.

In the examples of the present disclosure, the first transistor 611 and the second transistor 612 are P-type transistors, for example, a positive channel metal-oxide-semiconductor field-effect transistor (PMOS).

A first end of the second charge sub-circuit is coupled to the first end of the charge circuit 610, and a second end of the second charge sub-circuit is coupled to the second end of the charge circuit 610. The second charge sub-circuit comprises a third transistor 613. That is, a first end of the third transistor 613 is configured to input the supply voltage, and a second end of the third transistor 613 is coupled to the sensing node SO. A control end of the third transistor 613 is coupled to a second output end of the control logic circuit 320. In the examples of the present disclosure, the third transistor 613 is a P-type transistor.

The control logic circuit 320 is configured to: control the first transistor 611 to be turned on or turned off, and control the third transistor 613 to be turned on or turned off. In addition, the control logic circuit 320 first controls the third transistor 613 to be turned off, and then controls the first transistor 611 to be turned off. In the examples of the present disclosure, the control logic circuit 320 may control the third transistor 613 and the first transistor 611 to be simultaneously turned on. The first latch circuit 500 is configured to control the second transistor 612 to be turned on or turned off. When the programmed state of the first memory cell is the first state, the second transistor 612 is turned on, and the first charge sub-circuit and the second charge sub-circuit simultaneously charge the sensing node SO. The control logic circuit 320 controls the first transistor 611 to be turned off after the third transistor 613 is turned off. Therefore, when the second charge sub-circuit stops charging the sensing node SO, the first charge sub-circuit still continues charging the sensing node SO. That is, when the programmed state of the first memory cell is the first state, the first charge sub-circuit actually charges the sensing node SO. When the programmed state of the first memory cell is the second state, the second transistor 612 is turned off, and therefore only a third memory cell 223 can be turned on, to make the second charge sub-circuit charge the sensing node SO.

As shown in FIG. 10, in some examples, the output end of the first latch circuit 500 is coupled to the discharge circuit 620, a first end of the discharge circuit 620 is coupled to the bit line, and a second end of the discharge circuit 620 is coupled to the sensing node SO.

In an example, the discharge circuit 620 may comprise a plurality of discharge sub-circuits. The plurality of discharge sub-circuits correspond to a plurality of programmed states of the first memory cell. In an example, the discharge circuit 620 comprises a first discharge sub-circuit and a second discharge sub-circuit.

A first end of the second discharge sub-circuit is coupled to the first end of the discharge circuit 620, and a second end of the second discharge sub-circuit is coupled to the second end of the discharge circuit 620. The second discharge sub-circuit comprises a fourth transistor 621 and a fifth transistor 622. That is, a first end of the fourth transistor 621 is coupled to the bit line, a second end of the fourth transistor 621 is coupled to a first end of the fifth transistor 622, and a second end of the fifth transistor 622 is coupled to the sensing node SO. A control end of the fourth transistor 621 is coupled to a third output end of the control logic circuit 320, and a control end of the fifth transistor 622 is coupled to the output end of the first latch circuit 500.

In the examples of the present disclosure, the fourth transistor 621 is an N-type MOS transistor, the fifth transistor 622 may comprise one N-type MOS transistor and one P-type MOS transistor. The N-type MOS transistor and the P-type MOS transistor are coupled in parallel.

A first end of the first discharge sub-circuit is coupled to the first end of the discharge circuit 620, and a second end of the first discharge sub-circuit is coupled to the second end of the discharge circuit 620. The first discharge sub-circuit comprises a sixth transistor 623. That is, a first end of the sixth transistor 623 is coupled to the bit line, and a second end of the sixth transistor 623 is coupled to the sensing node SO. A control end of the sixth transistor 623 is coupled to a fourth output end of the control logic circuit 320. In the examples of the present disclosure, the sixth transistor 623 is an N-type MOS transistor.

The control logic circuit 320 is configured to: control the fourth transistor 621 to be turned on or turned off, and control the sixth transistor 623 to be turned on or turned off. In addition, the control logic circuit 320 first controls the sixth transistor 623 to be turned off, and then controls the fourth transistor 621 to be turned off. In the examples of the present disclosure, the control logic circuit may control the sixth transistor 623 and the fourth transistor 621 to be simultaneously turned on. The first latch circuit 500 is configured to control the fifth transistor 622 to be turned on or turned off. When the programmed state of the first memory cell is the second state, the fifth transistor 622 is turned on, and the sensing node SO applies a bit line voltage to the bit line through the first discharge sub-circuit and the second discharge sub-circuit, so as to discharge the sensing node SO. The control logic circuit 320 controls the first transistor 611 to be turned off after the third transistor 613 is turned off. Therefore, when the second charge sub-circuit stops discharging the sensing node SO, the first charge sub-circuit still continues discharging the sensing node SO. That is, when the programmed state of the first memory cell is the second state, the second discharge sub-circuit actually discharges the sensing node SO. When the programmed state of the first memory cell is the first state, the fifth transistor 622 is turned off. Therefore, only the sensing node SO can be discharged through the first discharge sub-circuit.

In some examples, the first latch circuit 500 is further simultaneously coupled to the charge circuit 610 and the discharge circuit 620. That is, the first latch circuit 500 simultaneously controls the moment at which the charge circuit 610 stops charging the sensing node SO, and, controls the moment at which the discharge circuit 620 stops discharging the sensing node SO. This is not repeated here in the present disclosure.

As shown in FIG. 9, the first latch circuit 500 is coupled to the sensing node SO. The first latch circuit 500 comprises a first stage inverter 510, a second stage inverter 520, a seventh transistor 530, an eighth transistor 540, and a ninth transistor 550. An output end of the first stage inverter 510 is coupled with an input end of the second stage inverter 520, and an input end of the first stage inverter 510 is coupled with an output end of the second stage inverter 520. A first end of the seventh transistor 530 is coupled to the output end of the first stage inverter 510, a first end of the eighth transistor 540 is coupled to the output end of the second stage inverter 520, a control end of the ninth transistor 550 is coupled to the sensing node SO, a first end of the ninth transistor 550 is coupled with a second end of the seventh transistor 530 and a second end of the eighth transistor 540, and a second end of the ninth transistor 550 is coupled to the ground GND. A control end of the seventh transistor 530 is configured to receive a set signal, and the control end of the seventh transistor 530 is configured to receive a reset signal.

In an example, in the examples of the present disclosure, the seventh transistor 530, the eighth transistor 540, and the ninth transistor 550 may all be N-type MOS transistors. When the ninth transistor 550 is turned on under the action of a voltage of the sensing node SO, if the set signal is at a high level, the seventh transistor 530 is turned on, the output end of the first stage inverter 510 is at a low level, and the output end of the first stage inverter 510 is at a high level. If the reset signal is at a high level, the eighth transistor 540 is turned on, the output end of the second stage inverter 520 is at a low level, and the output end of the first stage inverter 510 is at a high level. That is, the programmed state of the first memory cell is distinguished through a high level and a low level. It should be understood that, a plurality of first latch circuits 500 may be disposed to distinguish between the plurality of programmed states of the first memory cell.

The second latch circuit 700 (which may also be referred to as a sense latch) is coupled to the sensing node SO, and configured to latch, according to a voltage value of the sensing node after the discharge duration, information of whether the second memory cell passes program verification. The second latch circuit 700 comprises a third stage inverter 710, a fourth stage inverter 720, a tenth transistor 730, an eleventh transistor 740, a twelfth transistor 750, and a thirteenth transistor 760. An output end of the third stage inverter 710 is coupled with an input end of the fourth stage inverter 720, and an input end of the third stage inverter 710 is coupled with an output end of the fourth stage inverter 720. A first end of the tenth transistor 730 is coupled to the output end of the third stage inverter 710, and is configured to output the information of whether the second memory cell passes the program verification. A first end of the eleventh transistor 740 is coupled to the output end of the fourth stage inverter 720, a control end of the twelfth transistor 750 is coupled to the sensing node SO, a first end of the twelfth transistor 750 is coupled with a second end of the tenth transistor 730 and a second end of the eleventh transistor 740, and a second end of the twelfth transistor 750 is coupled to the ground GND. The thirteenth transistor 760 and the twelfth transistor 750 are coupled in parallel.

Typically, FIG. 9 further shows an example of some other circuit structures, for example, a fourteenth transistor 810 and a fifteenth transistor 820 coupled between a power supply VDD and the charge circuit 610, and a sixteenth transistor 830 coupled between the bit line and the discharge circuit 620. The fourteenth transistor 810 and the fifteenth transistor 820 are P-type MOS transistors, the sixteenth transistor 830 is an N-type MOS transistor, and the fourteenth transistor 810 is configured to receive the information of whether the second memory cell passes the program verification.

No improvements are made to these structures in the examples of the present disclosure, and therefore these structures should not be understood as a limitation to the present disclosure. Ranther, in an implementation, these structures may use other circuit forms in some examples.

Figure 11:
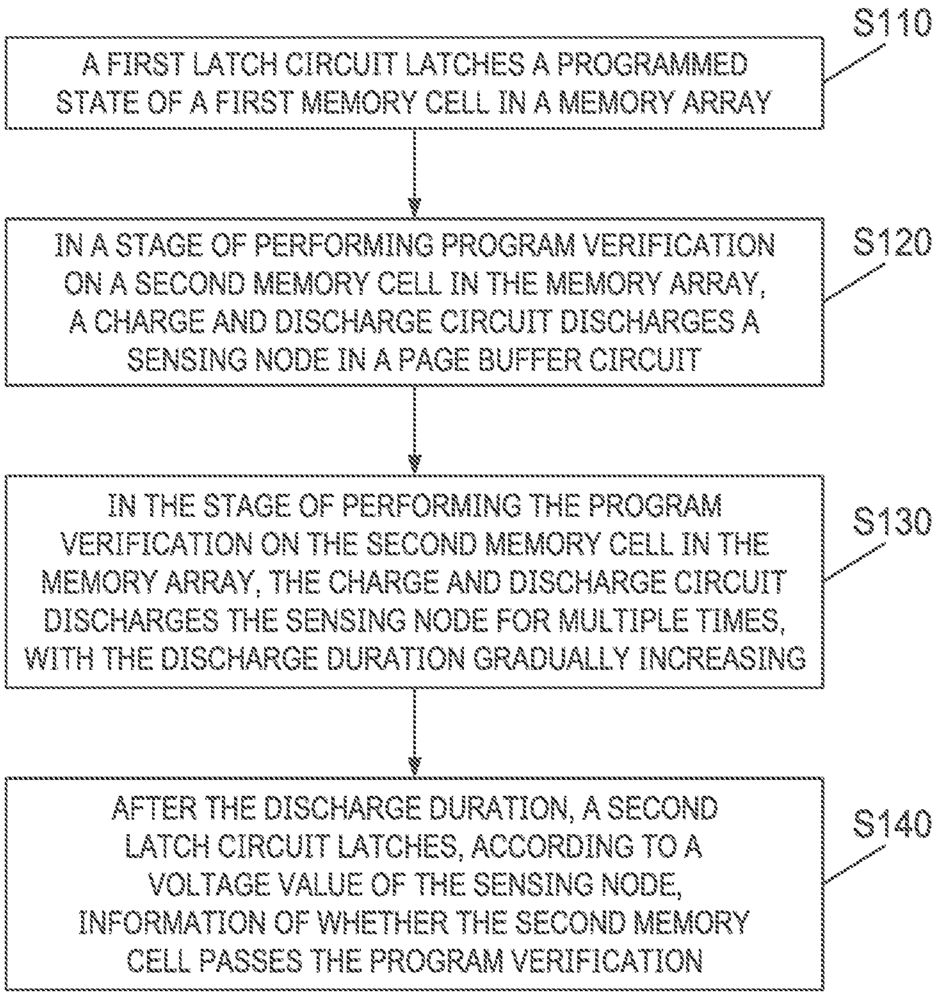
FIG. 11 is a schematic flow diagram of an operation method of memory device provided by examples of the present disclosure.

As shown in FIG. 11, the examples of the present disclosure provide an operation method of a memory device, comprising operations S110-S140, as follows.

S110: A first latch circuit latches a programmed state of a first memory cell in a memory array.

In an example, a first latch circuit 500 may latch the programmed state of the first memory cell before programming a second memory cell. The first memory cell and the second memory cell are located on a same memory cell string 220, and the first memory cell and the second memory cell are adjacent.

For memory devices 120 of types such as an MLC, a TLC, and a QLC, etc., the first memory cell has a plurality of programmed levels. Therefore, in the present disclosure, the first memory cell may be classified into a plurality of programmed states according to a programmed level of the first memory cell, to avoid that an excessive number of first latch circuits 500 are disposed, causing a circuit of the page buffer 380 having an excessively large area. In an example, the programmed state of the first memory cell comprises a first state and a second state, and a threshold voltage of the first memory cell when in the first state is greater than a threshold voltage when in the second state. A correspondence relationship between the programmed state of the first memory cell and programmed level may be shown in the follow Table 1:

TABLE 1

| Type | First state | Second state |
|---|---|---|
| MLC | L2, L3 | L0, L1 |
| TLC | L4, L5, L6, L7 | L0, L1, L2, L3 |
| QLC | L8, L9, L10, L11<br>L12, L13, L14, L15 | L0, L1, L2, L3<br>L4, L5, L6, L7 |

S120: In a stage of performing program verification on the second memory cell in the memory array, the charge and discharge circuit discharges a sensing node in a page buffer circuit.

Figure 12:
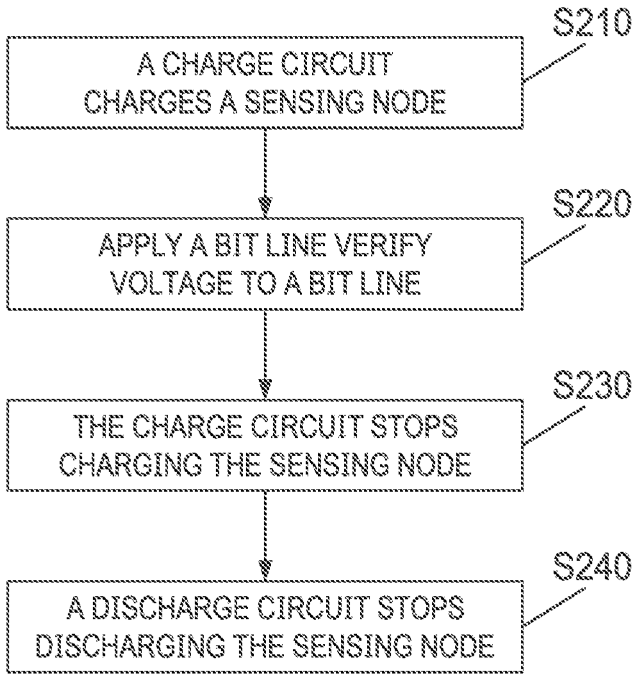
FIG. 12 is a schematic flow diagram of a discharging a sensing node provided by examples of the present disclosure.

In an example, after discharge duration, if a voltage value of a sensing node SO is greater than the threshold voltage, the second memory cell passes the program verification. If the voltage value of the sensing node SO is less than the threshold voltage, the second memory cell fails to pass the program verification. In the examples of the present disclosure, in the stage of performing the program verification on the second memory cell, the discharge duration of the sensing node SO is related to the programmed state of the first memory cell. When the programmed state of the first memory cell is lower, the discharge duration of the sensing node SO during verification of the second memory cell is longer. As shown in FIG. 12, the discharging the sensing node SO may comprise operation S210-operation S240, as follows.

S210: A charge circuit charges the sensing node.

In an example, a first end of a charge circuit 610 is configured to input a supply voltage, and a second end of the charge circuit 610 is coupled to the sensing node SO. The first end and the second end of the charge circuit 610 are first turned on, and the charge circuit 610 applies the supply voltage to the sensing node SO, so as to charge the sensing node SO.

S220: Apply a bit line voltage to a bit line.

In an example, the bit line is coupled to a first end of a discharge circuit 620, and a second end of the discharge circuit 620 is coupled to the sensing node SO. Then the first end and the second end of the discharge circuit 620 are turned on, and a capacitor Cso coupled with the sensing node SO applies the bit line voltage to the bit line. In this case, because the charge circuit 610 still charges the sensing node SO, the capacitor Cso (or a parasitic capacitor) coupled with the sensing node SO does not start discharging.

S230: The charge circuit stops charging the sensing node.

In an example, then the first end and the second end of the charge circuit 610 are turned off. In this case, the charge circuit 610 stops charging the sensing node SO, and the capacitor Cso (or the parasitic capacitor) coupled with the sensing node SO starts discharging.

S240: A discharge circuit stops discharging the sensing node.

In an example, finally the first end and the second end of the discharge circuit 620 are turned off, and the capacitor Cso (or the parasitic capacitor) coupled with the sensing node SO stops discharging. That is, the discharge duration of the sensing node SO is equal to a difference between a moment of stopping discharging the sensing node SO and a moment of stopping charging the sensing node SO.

Figure 13:
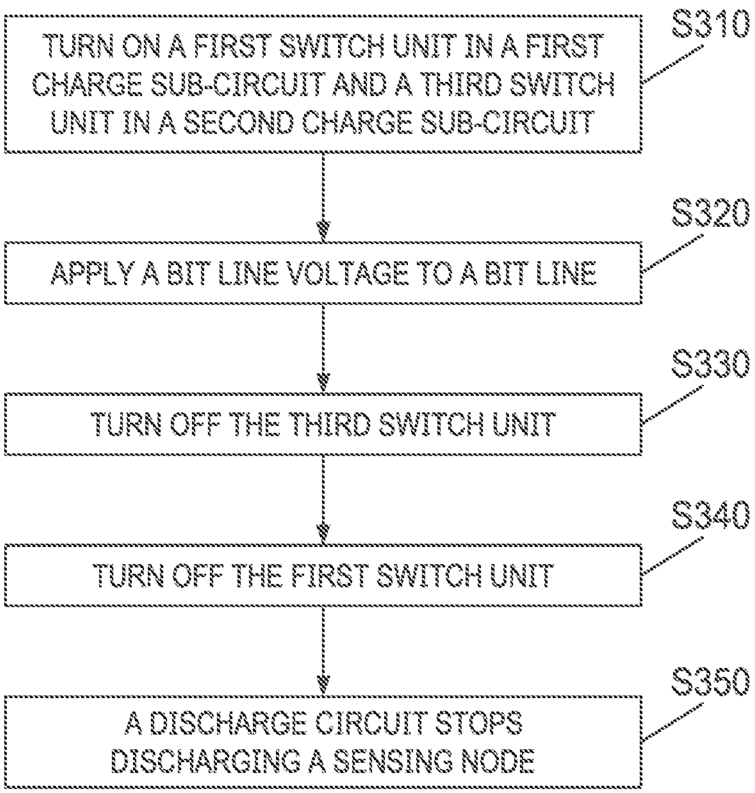
FIG. 13 is an example flow diagram of S120 provided by examples of the present disclosure.

In some examples, the programmed state of the first memory cell may be related to the moment at which the charge circuit 610 stops charging the sensing node SO. Therefore, as shown in FIG. 13, operation S120 may comprise operation S310-operation S350, as follows:

S310: Turn on a first transistor in a first charge sub-circuit and a third transistor in a second charge sub-circuit.

In an example, as shown in FIG. 9, a first end of a first transistor 611 is configured to input the supply voltage, and a second end of the first transistor 611 is coupled to a first end of a second transistor 612, and a second end of the second transistor 612 is coupled to the sensing node SO. A first end of a third transistor 613 is configured to input the supply voltage, and a second end of the third transistor 613 is coupled to the sensing node SO.

A control end of the first transistor 611 is configured to receive a signal S1 outputted by a first output end of a control logic circuit 320, and a control end of the third transistor 613 is configured to receive a signal S2 outputted by a second output end of the control logic circuit 320. When the signal S1 is at a high level, the first transistor 611 is turned off; and when the signal S1 is at a low level, the first transistor 611 is turned on. Similarly, when the signal S2 is at a high level, the third transistor 613 is turned off; and when the signal S2 is at a low level, the third transistor 613 is turned on.

A control end of the second transistor 612 is coupled to an output end of the first latch circuit 500. When the programmed state of the first memory cell is the first state, the second transistor 612 is turned on; and when the programmed state of the first memory cell is the second state, the second transistor 612 is turned off.

Figure 14:
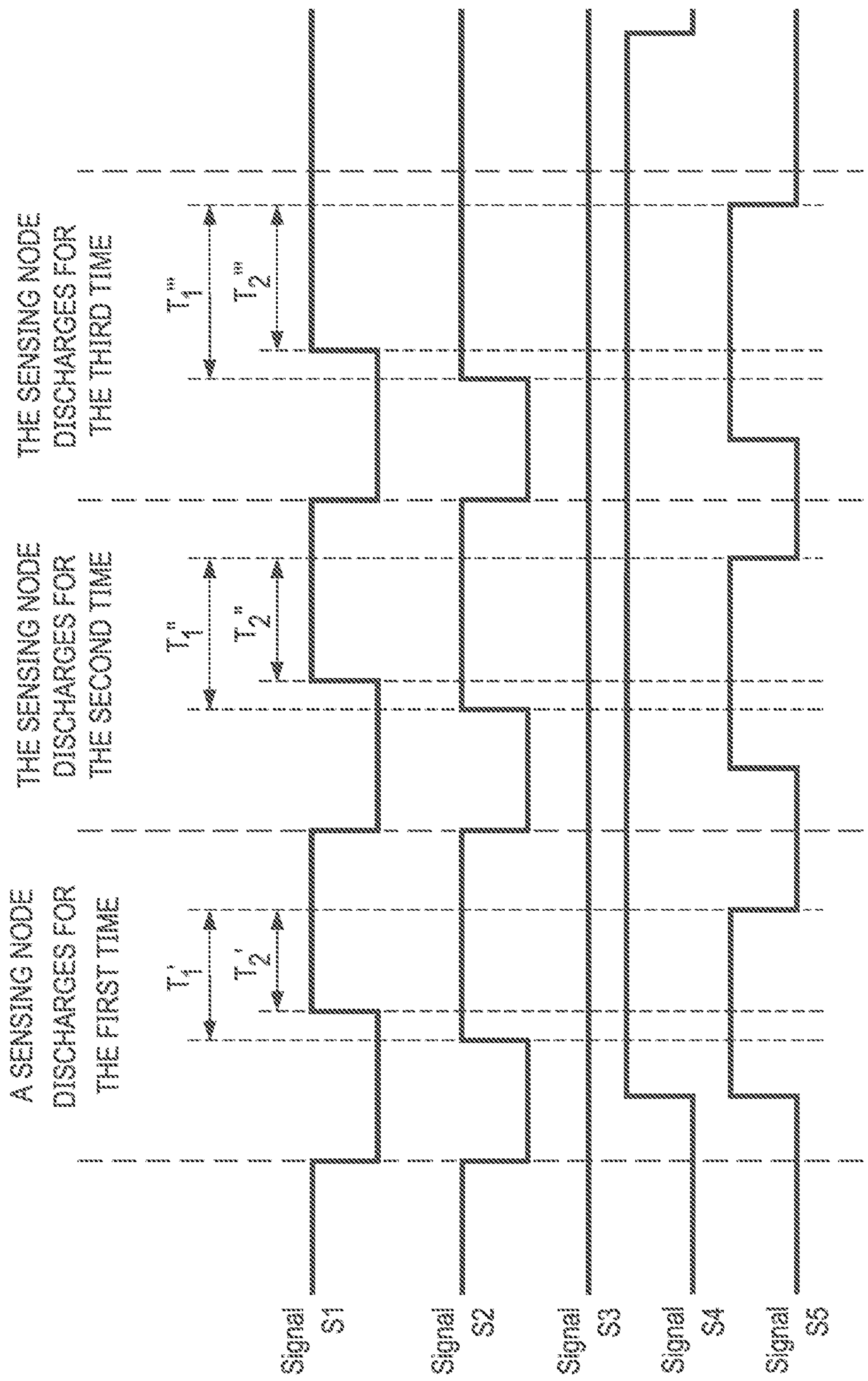
FIG. 14 is a schematic diagram of a waveform of a control signal for charging/discharging a sensing node provided by examples of the present disclosure.

In an example, FIG. 14 shows a schematic diagram of a waveform of a control signal for charging/discharging a sensing node. As shown in FIG. 14, falling edges first simultaneously appear in the signal S1 and the signal S2. That is, low levels are simultaneously applied to gates of the first transistor 611 and the third transistor 613, and the first transistor 611 and the third transistor 613 are turned on. In addition, the control logic circuit 320 outputs a signal S3, to make a fifteenth transistor 820 between the power supply VDD and a first end of the charge circuit 610 turned on.

That is, when falling edges simultaneously appear in the signal S1 and the signal S2, if the programmed state of the first memory cell is the first state, the first charge sub-circuit and the second charge sub-circuit simultaneously charge the sensing node SO. If the programmed state of the first memory cell is the second state, the second charge sub-circuit can charge the sensing node SO. That is, the charge circuit 610 charges the sensing node SO.

S320: Apply a bit line voltage to a bit line.

In an example, as shown in FIG. 9, the bit line is coupled to a first end of a discharge circuit 620, and a second end of the discharge circuit 620 is coupled to the sensing node SO. When a signal S5 is at a low level, the first end and the second end of the discharge circuit 620 are turned off; and when the signal S5 is at a high level, the first end and the second end of the discharge circuit 620 are turned on. In addition, the control logic circuit 320 outputs a signal S4. When the signal S4 is at a low level, a sixteenth transistor 830 between the first end of the discharge circuit 620 and the bit line is turned off; and when the signal S4 is at a high level, the sixteenth transistor 830 between the first end of the discharge circuit 620 and the bit line is turned on.

As shown in FIG. 14, next, rising edges appear in the signal S4 and the signal S5. That is, high levels are applied to gates of a control end of the discharge circuit 620 and the sixteenth transistor 830. In this way, when rising edges appear in the signal S4 and the signal S5, the capacitor Cso coupled with the sensing node SO applies the bit line voltage to bit line. In this case, because the charge circuit 610 still charges the sensing node SO, the capacitor Cso (or a parasitic capacitor) coupled with the sensing node SO does not start discharging.

S330: Turn off the third transistor.

In an example, then a rising edge appears in the signal S2. That is, a high level is applied to the gate of the third transistor 613, and the third transistor 613 is turned off. In this case, if the programmed state of the first memory cell is the first state, the third transistor 613 is turned off to make the second charge sub-circuit stop charging the sensing node SO, the first charge sub-circuit still continues charging the sensing node SO, and the sensing node SO does not start discharging. If the programmed state of the first memory cell is the second state, because only the second charge sub-circuit can charge the sensing node SO, when the third transistor 613 is turned off, the charge circuit 610 stops charging the sensing node SO, and the sensing node SO starts discharging.

S340: Turn off the first transistor.

In an example, then a rising edge appears in the signal S1. That is, a high level is applied to the gate of the first transistor 611, and the first transistor 611 is turned off. If the programmed state of the first memory cell is the first state, when the third transistor 613 is turned off in operation S330, only the second charge sub-circuit stops charging the sensing node SO, and the first charge sub-circuit still charges the sensing node SO. When the first transistor 611 is turned off, the first charge sub-circuit stops charging the sensing node SO, and the sensing node SO starts discharging. If the programmed state of the first memory cell is the second state, only the second charge sub-circuit can charge the sensing node SO. Therefore, when the third transistor 613 is turned off in operation S330, the sensing node SO starts discharging.

S350: A discharge circuit stops discharging the sensing node.

In an example, finally a falling edge appears in the signal S5. That is, a low level is applied to the control end of the discharge circuit 620, the first end and the second end of the discharge circuit 620 are turned off, and the discharge circuit 620 stops discharging the sensing node SO.

As shown in FIG. 14, if operation S310-operation S350 are performed, when the programmed state of the first memory cell is the first state, the discharge duration of the sensing node SO is first duration, and the first duration is equal to a difference between a moment of performing operation S350 and a moment of performing operation S340; and when the programmed state of the first memory cell is the second state, the discharge duration of the sensing node SO is a second duration, and the second duration is equal to a difference between the moment of performing operation S350 and a moment of performing operation S330. As can be seen, the first duration is less than the second duration.

Figure 15:
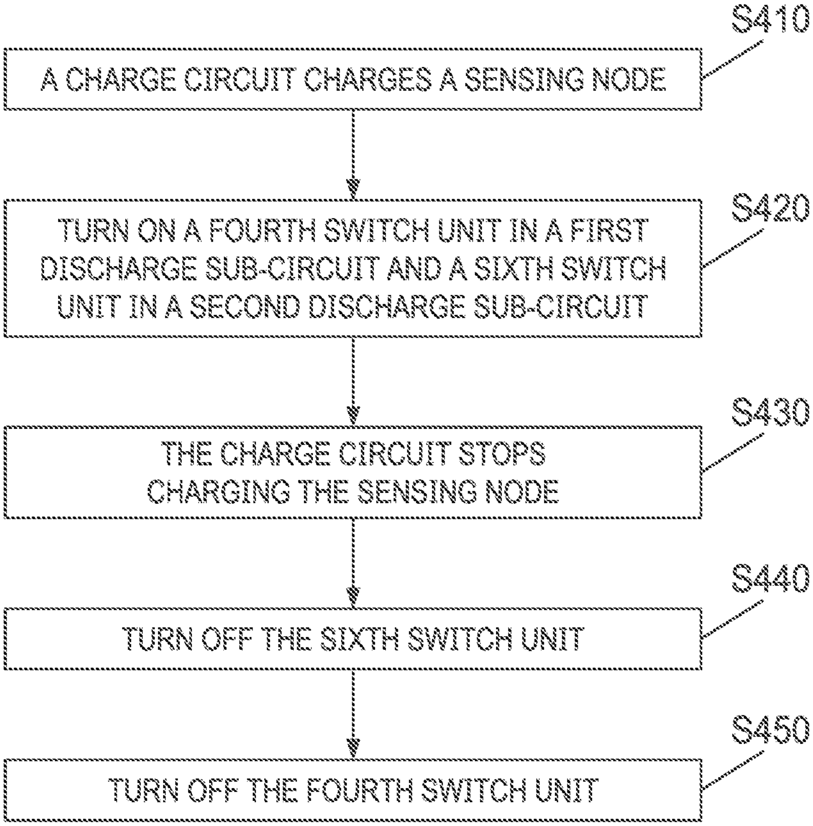
FIG. 15 is another example flow diagram of S120 provided by examples of the present disclosure.

In some examples, the programmed state of the first memory cell may further be related to the moment at which the discharge circuit 620 stops discharging the sensing node SO. Therefore, as shown in FIG. 15, operation S120 may further comprise operation S410-operation S450, as follows.

S410: A charge circuit charges the sensing node.

In an example, as shown in FIG. 10, a first end of a charge circuit 610 is configured to input a supply voltage, and a second end of the charge circuit 610 is coupled to the sensing node SO. The charge circuit 610 is configured to receive a signal S8 outputted by the control logic circuit 320, when the signal S8 is at a low level, the first end and second end of the charge circuit 610 are turned on; and when the signal S8 is at a high level, the first end and the second end of the charge circuit 610 are turned off.

Figure 16:
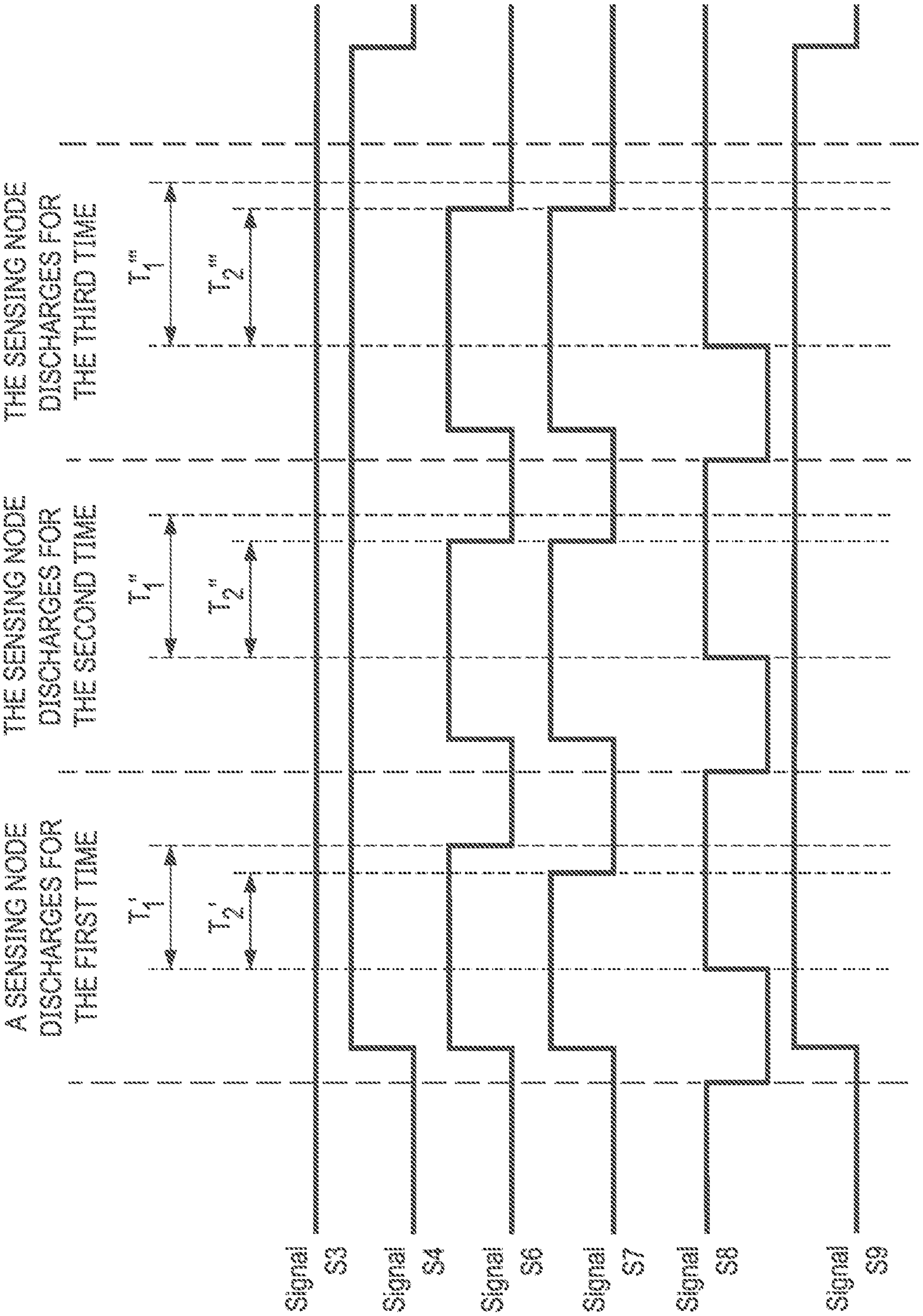
FIG. 16 is another schematic diagram of a waveform of a control signal for charging/discharging a sensing node provided by examples of the present disclosure.

In an example, FIG. 16 shows another schematic diagram of a waveform of a control signal for charging/discharging a sensing node. As shown in FIG. 16, first a falling edge appears in the signal S8. That is, a low level is applied to a control end of the charge circuit 610, and the first end and the second end of the charge circuit 610 are turned on. In addition, the control logic circuit 320 outputs a signal S3, to make a fifteenth transistor 820 between the power supply VDD and a first end of the charge circuit 610 turned on. In this way, when a falling edge appears in the signal S8, the charge circuit 610 charges the sensing node SO.

S420: Turn on a fourth transistor in a first discharge sub-circuit and a sixth transistor in a second discharge sub-circuit.

In an example, as shown in FIG. 10, a first end of a fourth transistor 621 is coupled to a bit line, and a second end of the fourth transistor 621 is coupled to a first end of a fifth transistor 622, and a second end of the fifth transistor 622 is coupled to the sensing node SO. A first end of a sixth transistor 623 is coupled to the bit line, and a second end of the sixth transistor 623 is coupled to the sensing node SO.

A control end of the fourth transistor 621 is configured to receive a signal S6 outputted by a first output end of the control logic circuit 320, and a control end of the sixth transistor 623 is configured to receive a signal S7 outputted by the second output end of the control logic circuit 320. When the signal S6 is at a low level, the fourth transistor 621 is turned off; and when the signal S2 is at a high level, the fourth transistor 621 is turned on. Similarly, when the signal S6 is at a low level, the sixth transistor 623 is turned off; and when the signal S6 is at a high level, the sixth transistor 623 is turned on.

A control end of the fifth transistor 622 is coupled to the output end of the first latch circuit 500. When the programmed state of the first memory cell is the second state, the fifth transistor 622 is turned on; and when the programmed state of the first memory cell is the first state, the fifth transistor 622 is turned off.

As shown in FIG. 16, next, rising edges appear in the signal S6 and the signal S7. That is, high levels are simultaneously applied to gates of the fourth transistor 621 and the sixth transistor 623, and the fourth transistor 621 and the sixth transistor 623 are turned on. In addition, the control logic circuit 320 outputs a signal S4 and a signal S9. When the signal S4 and the signal S9 are at a high level, the sixteenth transistor 830 between the bit line and the first end of the discharge circuit 620 is turned on.

In this case, the charge circuit 610 still charges the sensing node SO. That is, when rising edges simultaneously appear on the signal S6 and the signal S7, if the programmed state of the first memory cell is the second state, the sensing node SO applies the bit line voltage to the bit line through the first discharge sub-circuit and the second discharge sub-circuit; and if the programmed state of the first memory cell is the first state, the sensing node SO can only apply the bit line voltage to the bit line through the first discharge sub-circuit.

S430: A charge circuit stops charging the sensing node.

In an example, then a rising edge appears in the signal S8. That is, a high level is applied to the control end of the charge circuit 610. The first end and the second end of the charge circuit 610 are turned off, the charge circuit 610 stops discharging the sensing node SO, and the capacitor Cso (or the parasitic capacitor) coupled with the sensing node SO starts discharging.

S440: Turn off the sixth transistor.

In an example, then a falling edge appears in the signal S7. That is, a low level is applied to a gate of the sixth transistor 623, and the sixth transistor 623 is turned off. In this case, if the programmed state of the first memory cell is the first state, only the first discharge sub-circuit can discharge the sensing node SO. When the sixth transistor 623 is turned off, the first discharge sub-circuit stops discharging the sensing node SO, so that the discharge circuit 620 stops discharging the sensing node SO. If the programmed state of the first memory cell is the second state, the sixth transistor 623 is turned off to make the first discharge sub-circuit stop discharging the sensing node SO, and the second discharge sub-circuit further continues discharging the sensing node SO. That is, the sensing node SO does not stop discharging.

S450: Turn off the fourth transistor.

In an example, then a falling edge appears in the signal S6. That is, a low level is applied to a gate of the fourth transistor 621, and the fourth transistor 621 is turned off. In this case, if the programmed state of the first memory cell is the first state, only the first discharge sub-circuit can discharge the sensing node SO. Therefore, when the sixth transistor 623 is turned off in operation S440, the sensing node SO stops discharging. If the programmed state of the first memory cell is the second state, the sixth transistor 623 is turned off in operation S440, only the first discharge sub-circuit stops discharging the sensing node SO, and the second discharge sub-circuit still discharges the sensing node SO. When the fourth transistor 621 is turned off, the second discharge sub-circuit stops discharging the sensing node SO, and the sensing node SO stops discharging.

As shown in FIG. 16, if operation S410-operation S450 are performed, when the programmed state of the first memory cell is the first state, the discharge duration of the sensing node SO is first duration, and the first duration is equal to a difference between a moment of performing operation S440 and a moment of performing operation S430; and when the programmed state of the first memory cell is the second state, the discharge duration of the sensing node SO is a second duration, and the second duration is equal to a difference between the moment of performing operation S450 and a moment of performing operation S430. As can be seen, the first duration is less than the second duration.

Figure 17:
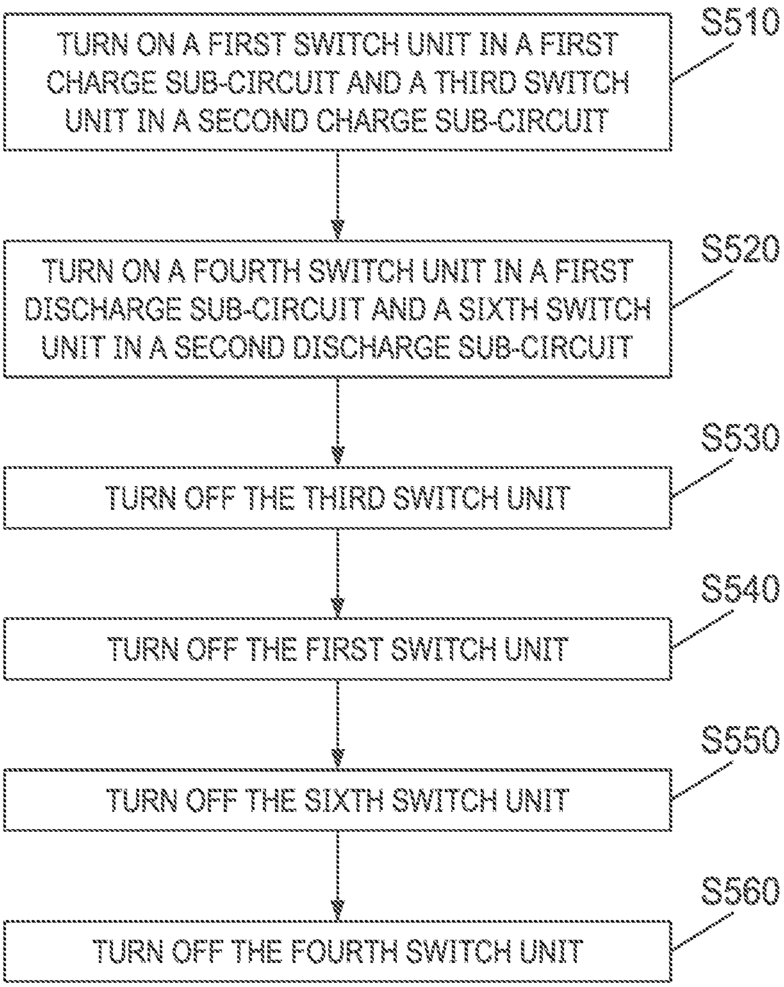
FIG. 17 is yet another example flow diagram of S120 provided by examples of the present disclosure.

Additionally, the programmed state of the first memory cell may further be related to both the moment at which the charge circuit 610 stops charging the sensing node SO and the moment at which the discharge circuit 620 stops discharging the sensing node SO. Therefore, as shown in FIG. 17, operation S120 may further comprise operation S510-operation S560. Operation S510 and operation S310 are the same, operation S520 and operation S420 are the same, operation S530 and operation S330 are the same, operation S540 and operation S340 are the same, operation S550 and operation S440 are the same, and operation S560 and operation S450 are the same. This is not repeated here in the present disclosure.

As shown in FIG. 17, if operation S510-operation S560 are performed, when the programmed state of the first memory cell is the first state, the discharge duration of the sensing node SO is first duration, and the first duration is equal to a difference between a moment of performing operation S550 and a moment of performing operation S540; and when the programmed state of the first memory cell is the second state, the discharge duration of the sensing node SO is a second duration, and the second duration is equal to a difference between the moment of performing operation S560 and a moment of performing operation S530. As can be seen, the first duration is less than the second duration.

S130: In the stage of performing the program verification on the second memory cell in the memory array, the charge and discharge circuit discharges the sensing node for multiple times, with the discharge duration gradually increasing.

In an example, at the same verify voltage, when the threshold voltage of the second memory cell is higher, a discharge rate of the sensing node SO is lower. In the present disclosure, at the same verify voltage, sensing node SO is discharged for multiple times by gradually increasing the discharge duration, so as to classify the threshold voltage of the second memory cell.

Figure 18:
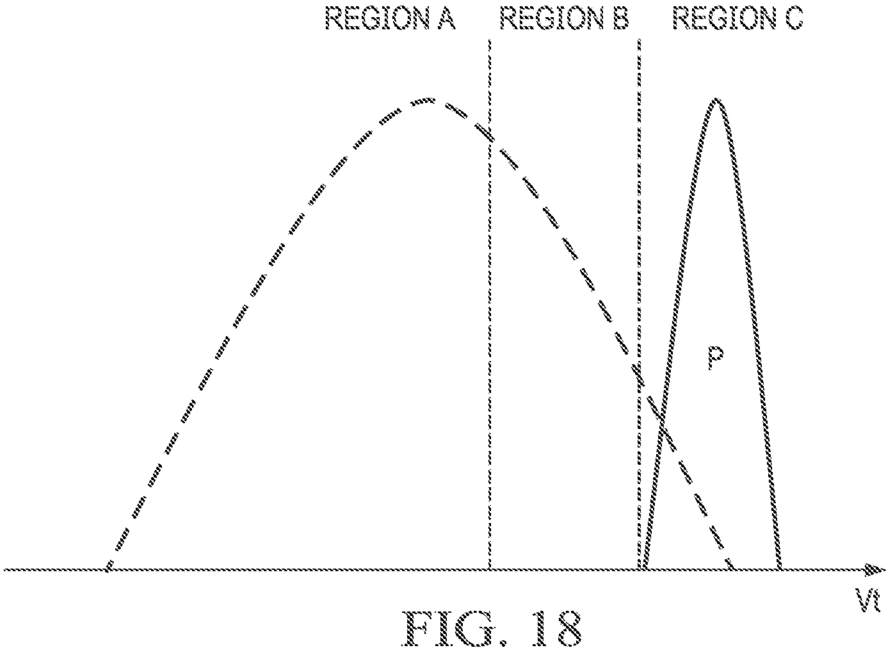
FIG. 18 is a schematic diagram of division regions of performing threshold voltage division on a second memory cell in S130 provided by examples of the present disclosure.

In an example, as shown in FIG. 18, if the voltage of the sensing node SO is less than the threshold voltage after short discharge duration, it indicates that the discharge rate of the sensing node SO is high (a large number of charges are released within the short discharge duration), and the threshold voltage of the second memory cell is low. That is, the second memory cell is located in a region a as shown in FIG. 18.

If the voltage of the sensing node SO is greater than the threshold voltage after long discharge duration, it indicates that the discharge rate of the sensing node SO is low (a small number of charges are released within the long discharge duration), and the threshold voltage of the second memory cell is high. That is, the second memory cell is located in a region c shown in FIG. 18.

If the voltage of the sensing node SO is greater than the threshold voltage after short discharge duration, and the voltage of the sensing node SO is less than the threshold voltage after long discharge duration, it indicates that the threshold voltage of the second memory cell is between the threshold voltages in above-mentioned two cases. That is, the second memory cell is located in a region b shown in FIG. 18.

Figure 19:
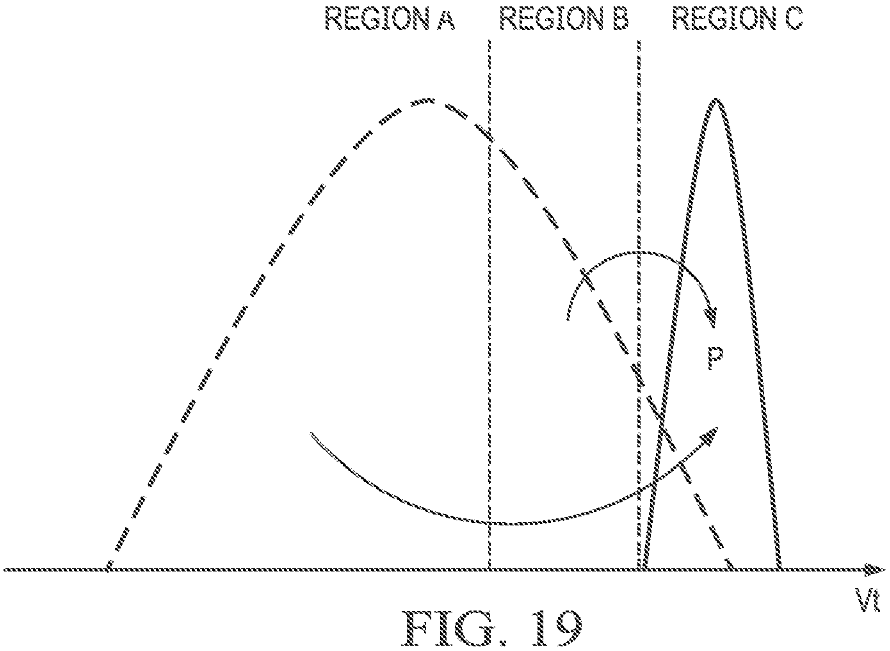
FIG. 19 is a schematic diagram of a program result of a next program cycle provided by examples of the present disclosure.

The second memory cell located in the region c is a memory cell that passes verification. In a program stage of a next program cycle, different bit line voltages may be applied to second memory cells located in different regions. For example, for a second memory cell located in the region a, in a next program cycle, a bit line voltage of 0 V is applied to a bit line coupled with the second memory cell, so as to program the second memory cell. For a second memory cell located in the region b, in a next program cycle, a bit line voltage of 0.5 V is applied to a bit line coupled with the second memory cell, to slightly prevent programming of the second memory cell. For a second memory cell located in the region c, in a next program cycle, a bit line voltage of 2.2 V is applied to a bit line coupled with the second memory cell, to prevent programming of the second memory cell. As shown in FIG. 19, after a program stage of the next program cycle, the threshold voltage of the second memory cell located in the region a increases greatly, the threshold voltage of the second memory cell located in the region b increases slightly, and the threshold voltage of the second memory cell located in the region c remains unchanged. Accurate programming of the second memory cell is achieved.

S140: After the discharge duration, the second latch circuit latches, according to a voltage value of the sensing node, information of whether the second memory cell passes the program verification.

In an example, if the second memory cell passes verification, after the discharge duration, no significant voltage drop occurs in the sensing node SO. That is, the voltage of the sensing node is greater than a preset threshold voltage. In this case, the second latch circuit 700 latches first information for indicating that the second memory cell passes verification. If the second memory cell does not pass verification, after the discharge duration, a significant voltage drop occurs in the sensing node SO. That is, the voltage of the sensing node is less than the preset threshold voltage. In this case, the second latch circuit 700 latches second information for indicating that the second memory cell does not pass verification.

Examples of the present disclosure further provide a computer readable storage medium which stores a computer executable instruction that, after being executed, can achieve the various operations in the above-mentioned method examples, for example, perform the methods shown in FIG. 11-FIG. 17.

Examples of the present disclosure provide a computer apparatus, which comprises a processor, and a readable storage medium coupled with the processor, wherein the readable storage medium stores an executable instruction that, when being executed by the processor, can achieve the various operations in the above-mentioned method example, for example, perform the methods shown in FIG. 11-FIG. 17.

For the memory device, the operation method of the memory device, and the memory system provided by the examples of the present disclosure, the first latch circuit 500 is disposed in the page buffer 380. The first latch circuit 500 is coupled to the sensing node SO and the charge and discharge circuit 600 configured to discharge the sensing node SO, and is configured to latch the programmed state of the first memory cell. In this way, during verification of one programmed state of the second memory cell (which is adjacent to the first memory cell), in the present disclosure, the discharge duration of the sensing node SO by the charge and discharge circuit 600 is controlled according to the programmed state of the first memory cell latched by the first latch circuit 500. At a same verify voltage, when the discharge duration is longer, more charges are released by the sensing node SO, a voltage drop value of the sensing node SO is larger, and it is more difficult for the second memory cell to pass verification. The second memory cell continues to be programmed, to make the second memory cell store more charges. That is, at the same verify voltage, different discharge duration may make the second memory cell store different numbers of charges. Compared with the other solution in which a plurality of (two or more) different verify voltages are sequentially used to perform repeated verification, only one verify voltage is used to verify the second memory cell in the present disclosure, so that program duration is greatly shortened.

Those skilled in the art can clearly appreciate that, for ease and simplicity of description, in the above examples, the descriptions of various examples have their own emstages, and the portions of some example that are not described in detail may be referred to a corresponding process in the aforementioned method examples, which is no longer repeated herein.

It is to be understood that, in various examples of the present disclosure, sequence numbers of the above processes do not indicate an execution sequence, and an execution sequence of various processes shall be determined by functionalities and intrinsic logics thereof, and shall constitute no limitation on an implementation process of the examples of the present disclosure.

Those of ordinary skill in the art can recognize that the modules and algorithm operations of various examples as described in conjunction with the examples disclosed herein can be implemented in an electronic hardware, or a combination of a computer software and an electronic hardware. Whether these functions are performed by means of a hardware or a software depends on example applications and design constraints of the technical solution. Those skilled in the art can implement the described function using different methods for each example application, but such implementation should not be considered as exceeding the scope of the present disclosure.

The above descriptions are merely example implementations of the present disclosure, and the protection scope of the present disclosure is not limited to these. Any variation or replacement that may be readily figured out by those skilled in the art within the technical scope disclosed by the present disclosure shall be encompassed within the protection scope of the present disclosure. Therefore, the scope of protection of the present disclosure should be defined by the scope of protection of the claims.

What is claimed is:

1. A memory device, comprising:

a memory array comprising a first memory cell and a second memory cell that are coupled to a same bit line, and the first memory cell and the second memory cell are adjacent; and a peripheral circuit coupled to the memory array and comprising a page buffer circuit, wherein the page buffer circuit comprises:

a sensing node coupled to the bit line;

a first latch circuit coupled to the sensing node and configured to latch a programmed state of the first memory cell;

a charge and discharge circuit coupled to the sensing node and configured to: charge the sensing node, and discharge the sensing node, wherein a discharge duration of the sensing node is related to the programmed state of the first memory cell; and a second latch circuit coupled to the sensing node and configured to latch, according to a voltage value of the sensing node after the discharge duration, information of whether the second memory cell passes program verification.

2. The memory device of claim 1, wherein the charge and discharge circuit comprises:

a charge circuit, wherein a first end of the charge circuit is configured to input a supply voltage, a second end of the charge circuit is coupled to the sensing node, and the charge circuit is configured to charge the sensing node; and a discharge circuit, wherein a first end of the discharge circuit is coupled to the bit line, a second end of the discharge circuit is coupled to the sensing node, and the discharge circuit is configured to discharge the sensing node.

3. The memory device of claim 2, wherein the programmed state of the first memory cell comprises a first state and a second state, and a threshold voltage of the first memory cell when in the first state is greater than a threshold voltage when in the second state;

when the programmed state of the first memory cell is the first state, the discharge duration of the sensing node is first duration; and the discharge duration of the sensing node is equal to a difference between a moment at which the discharge circuit stops discharging the sensing node and a moment at which the charge circuit stops charging the sensing node;

when the programmed state of the first memory cell is the second state, the discharge duration is second duration; and the first duration is less than the second duration.

4. The memory device of claim 3, wherein the first latch circuit is coupled to the charge circuit, and the charge circuit comprises:

a first charge sub-circuit, wherein a first end of the first charge sub-circuit is coupled to the first end of the charge circuit, and a second end of the first charge sub-circuit is coupled to the second end of the charge circuit; and a second charge sub-circuit, wherein a first end of the second charge sub-circuit is coupled to the first end of the charge circuit, and a second end of the second charge sub-circuit is coupled to the second end of the charge circuit, wherein when the programmed state of the first memory cell is the first state, the first charge sub-circuit charges the sensing node; and when the programmed state of the first memory cell is the second state, the second charge sub-circuit charges the sensing node.

5. The memory device of claim 4, wherein the first charge sub-circuit comprises a first transistor and a second transistor; and a first end of the first transistor is coupled to the first end of the first charge sub-circuit, a second end of the first transistor is coupled to a first end of the second transistor, a second end of the second transistor is coupled to the second end of the first charge sub-circuit, and a control end of the second transistor is coupled to an output end of the first latch circuit; and the peripheral circuit further comprises a control logic circuit, and when the programmed state of the first memory cell is the first state, the second transistor is turned on; and the control logic circuit is configured to:

control the first transistor to be turned on, so that the first charge sub-circuit charges the sensing node; or control the first transistor to be turned off, so that the first charge sub-circuit stops charging the sensing node.

6. The memory device of claim 5, wherein the second charge sub-circuit comprises a third transistor, a first end of the third transistor is coupled to the first end of the second charge sub-circuit, and a second end of the third transistor is coupled to the second end of the second charge sub-circuit; and when the programmed state of the first memory cell is the second state, the second transistor is turned off; and the control logic circuit is configured to:

control the third transistor to be turned on, so that the second charge sub-circuit charges the sensing node; or control the third transistor to be turned off, so that the second charge sub-circuit stops charging the sensing node.

7. The memory device of claim 3, wherein the first latch circuit is coupled to the discharge circuit, and the discharge circuit comprises:

a first discharge sub-circuit, wherein a first end of the first discharge sub-circuit is coupled to the first end of the discharge circuit, and a second end of the first discharge sub-circuit is coupled to the second end of the discharge circuit; and a second discharge sub-circuit, wherein a first end of the second discharge sub-circuit is coupled to the first end of the discharge circuit, and a second end of the second discharge sub-circuit is coupled to the second end of the discharge circuit, wherein when the programmed state of the first memory cell is the first state, the first discharge sub-circuit discharges the sensing node; and when the programmed state of the first memory cell is the second state, the second discharge sub-circuit discharges the sensing node.

8. The memory device of claim 7, wherein the second discharge sub-circuit comprises a fourth transistor and a fifth transistor, a first end of the fourth transistor is coupled to the first end of the first discharge sub-circuit, a second end of the fourth transistor is coupled to a first end of the fifth transistor, a second end of the fifth transistor is coupled to the second end of the first discharge sub-circuit, and a control end of the fifth transistor is coupled to an output end of the first latch circuit; and the peripheral circuit further comprises a control logic circuit, and when the programmed state of the first memory cell is the second state, the fifth transistor is turned on, wherein the control logic circuit is configured to:

control the fourth transistor to be turned on, so that the second discharge sub-circuit discharges the sensing node; or control the fourth transistor to be turned off, so that the second discharge sub-circuit stops discharging the sensing node.

9. The memory device of claim 8, wherein the first discharge sub-circuit comprises a sixth transistor, a first end of the sixth transistor is coupled to the first end of the first discharge sub-circuit, and a second end of the sixth transistor is coupled to the second end of the first discharge sub-circuit; and when the programmed state of the first memory cell is the first state, the fifth transistor is turned off, and the control logic circuit is configured to:

control the sixth transistor to be turned on, so that the first discharge sub-circuit discharges the sensing node; or control the sixth transistor to be turned off, so that the first discharge sub-circuit stops discharging the sensing node.

10. An operation method of a memory device, wherein the memory device comprises:

a memory array; and a peripheral circuit coupled to the memory array and comprising a page buffer circuit, wherein the operation method comprises:

latching a programmed state of a first memory cell in the memory array;

in a stage of performing program verification on a second memory cell in the memory array, discharging a sensing node in the page buffer circuit, wherein a discharge duration of the sensing node is related to the programmed state of the first memory cell; and the first memory cell and the second memory cell are adjacent and are coupled to a same bit line, and the sensing node is coupled to the bit line; and after the discharge duration, latching, according to a voltage value of the sensing node, information of whether the second memory cell passes the program verification.

11. The operation method of claim 10, wherein the discharging the sensing node in the page buffer circuit comprises:

charging the sensing node;

applying a bit line voltage to the bit line;

stopping charging the sensing node, so that the sensing node starts discharging; and stopping discharging the sensing node, so that the sensing node stops discharging.

12. The operation method of claim 11, wherein the programmed state of the first memory cell comprises a first state and a second state, and a threshold voltage of the first memory cell when in the first state is greater than a threshold voltage when in the second state;

when the programmed state of the first memory cell is the first state, the discharge duration of the sensing node is first duration; and the discharge duration of the sensing node is equal to a difference between a moment of stopping discharging the sensing node and a moment of stopping charging the sensing node; and when the programmed state of the first memory cell is the second state, the discharge duration is second duration; and the first duration is less than the second duration.

13. The operation method of claim 12, wherein that the discharge duration of the sensing node is related to the programmed state of the first memory cell comprises:

the moment of stopping charging the sensing node is related to the programmed state of the first memory cell, wherein when the programmed state of the first memory cell is the first state, a first charge sub-circuit charges the sensing node; and when the programmed state of the first memory cell is the second state, a second charge sub-circuit charges the sensing node; and a moment at which the first charge sub-circuit stops charging the sensing node is later than a moment at which the second charge sub-circuit stops charging the sensing node.

14. The operation method of claim 13, wherein when the programmed state of the first memory cell is the first state, a second transistor in the first charge sub-circuit is turned on, and that the first charge sub-circuit charges the sensing node comprises:

turning on a first transistor in the first charge sub-circuit, so that the first charge sub-circuit charges the sensing node; and turning off the first transistor, so that the first charge sub-circuit stops charging the sensing node.

15. The operation method of claim 14, wherein when the programmed state of the first memory cell is the second state, the second transistor in the first charge sub-circuit is turned off, and that the second charge sub-circuit charges the sensing node comprises:

turning on a third transistor in the second charge sub-circuit, so that the second charge sub-circuit charges the sensing node; and turning off the third transistor, so that the second charge sub-circuit stops charging the sensing node.

16. The operation method of claim 15, wherein that the moment at which the first charge sub-circuit stops charging the sensing node is later than the moment at which the second charge sub-circuit stops charging the sensing node comprises:

first turning off the third transistor, and then turning off the first transistor.

17. The operation method of claim 12, wherein that the discharge duration of the sensing node is related to the programmed state of the first memory cell comprises:

the moment of stopping discharging the sensing node is related to the programmed state of the first memory cell, wherein when the programmed state of the first memory cell is the first state, a first discharge sub-circuit discharges the sensing node; and when the programmed state of the first memory cell is the second state, a second discharge sub-circuit discharges the sensing node; and a moment at which the second discharge sub-circuit stops discharging the sensing node is later than a moment at which the first discharge sub-circuit stops discharging the sensing node.

18. The operation method of claim 17, wherein when the programmed state of the first memory cell is the second state, a fifth transistor in the second discharge sub-circuit is turned on, and that the second discharge sub-circuit discharges the sensing node comprises:

turning on a fourth transistor in the second discharge sub-circuit, so that the second discharge sub-circuit discharges the sensing node; and turning off the fourth transistor, so that the second discharge sub-circuit stops discharging the sensing node.

19. The operation method of claim 18, wherein when the programmed state of the first memory cell is the first state, the fifth transistor in the second discharge sub-circuit is turned off, and that the first discharge sub-circuit discharges the sensing node comprises:

turning on a sixth transistor in the first discharge sub-circuit, so that the first discharge sub-circuit discharges the sensing node; and turning off the sixth transistor, so that the first discharge sub-circuit stops discharging the sensing node.

20. A memory system, comprising:

a memory controller configured to control a memory device; and the memory device comprising:

a memory array comprising a first memory cell and a second memory cell that are coupled to a same bit line, and the first memory cell and the second memory cell are adjacent; and a peripheral circuit coupled to the memory array and comprising a page buffer circuit, wherein the page buffer circuit comprises:

a sensing node coupled to the bit line;

a first latch circuit coupled to the sensing node and configured to latch a programmed state of the first memory cell;

a charge and discharge circuit coupled to the sensing node and configured to: charge the sensing node, and discharge the sensing node, wherein a discharge duration of the sensing node is related to the programmed state of the first memory cell; and a second latch circuit coupled to the sensing node and configured to latch, according to a voltage value of the sensing node after the discharge duration, information of whether the second memory cell passes program verification.

* * * * *